(12) United States Patent
Ishizuka et al.

(10) Patent No.: US 10,079,587 B2
(45) Date of Patent: Sep. 18, 2018

(54) PHASE SHIFTER, IMPEDANCE MATCHING CIRCUIT, MULTI/DEMULTIPLEXER, AND COMMUNICATION TERMINAL APPARATUS

(71) Applicant: Murata Manufacturing Co., Ltd., Nagaokakyo-shi, Kyoto-fu (JP)

(72) Inventors: Kenichi Ishizuka, Nagaokakyo (JP); Hiroshi Nishida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 65 days.

(21) Appl. No.: 15/409,685

(22) Filed: Jan. 19, 2017

(65) Prior Publication Data

US 2017/0133999 A1  May 11, 2017

Related U.S. Application Data

(63) Continuation of application No. PCT/JP2016/057914, filed on Mar. 14, 2016.

(30) Foreign Application Priority Data

Mar. 25, 2015 (JP) ................... 2015-062274
Aug. 7, 2015 (JP) ................... 2015-157569
Oct. 30, 2015 (JP) ................... 2015-215081

(51) Int. Cl.
*H03H 7/18* (2006.01)
*H03H 7/38* (2006.01)
(Continued)

(52) U.S. Cl.
CPC ............. *H03H 7/18* (2013.01); *H01Q 1/48* (2013.01); *H01Q 5/335* (2015.01); *H01Q 7/00* (2013.01);
(Continued)

(58) Field of Classification Search
CPC .............................................. H03H 7/18–7/27
See application file for complete search history.

(56) References Cited

U.S. PATENT DOCUMENTS 8,072,290 B2 * 12/2011 Rofougaran ........ H01L 23/5227
333/118
9,190,979 B2 * 11/2015 Granger-Jones ......... H03H 7/48
(Continued)

FOREIGN PATENT DOCUMENTS

EP   1 641 119 A2   3/2006
JP   07-38368 A    2/1995
(Continued)

OTHER PUBLICATIONS

Official Communication issued in International Patent Application No. PCT/JP2016/057914, dated May 31, 2016.

*Primary Examiner* — Dean Takaoka
*Assistant Examiner* — Alan Wong
(74) *Attorney, Agent, or Firm* — Keating & Bennett, LLP

(57) ABSTRACT

A phase shifter includes a transformer connected between a first port and a second port and including a first coil and a second coil that is magnetically coupled to the first coil, the transformer including a parasitic inductance component; and an impedance adjustment circuit including a reactance element that suppresses a deviation in impedance due to the parasitic inductance component of the transformer. A coupling coefficient between the first coil and the second coil of the transformer and a value of the reactance element of the impedance adjustment circuit are determined such that a phase-shift amount changes in accordance with a frequency band.

19 Claims, 26 Drawing Sheets

(51) Int. Cl.
*H01Q 5/335* (2015.01)
*H01Q 1/48* (2006.01)
*H01Q 7/00* (2006.01)
*H01Q 21/22* (2006.01)
*H03H 7/01* (2006.01)
*H03H 9/64* (2006.01)
*H03H 7/09* (2006.01)
*H03H 7/20* (2006.01)
*H03H 9/72* (2006.01)

(52) U.S. Cl.
CPC .......... *H01Q 21/22* (2013.01); *H03H 7/0161* (2013.01); *H03H 7/09* (2013.01); *H03H 7/20* (2013.01); *H03H 7/38* (2013.01); *H03H 9/64* (2013.01); *H03H 9/725* (2013.01)

(56) References Cited

U.S. PATENT DOCUMENTS 9,450,650 B2 * 9/2016 Li .......................... H01L 24/00
9,831,550 B2 * 11/2017 Kawai ..................... H01Q 3/36
2008/0278258 A1 * 11/2008 Liu .......................... H03H 7/42
　　　　　　　　　　　　　　　　　　　333/25
2013/0207739 A1 * 8/2013 Bakalski ................. H03H 7/40
　　　　　　　　　　　　　　　　　　　333/33
2015/0070242 A1 3/2015 Kawai
2016/0182003 A1 * 6/2016 Teshima ................. H03H 7/38
　　　　　　　　　　　　　　　　　　　455/73

FOREIGN PATENT DOCUMENTS

| | | |
|---|---|---|
| JP | 11-154804 A | 6/1999 |
| JP | 2003-318701 A | 11/2003 |
| JP | 2004-343735 A | 12/2004 |
| JP | 2006-129445 A | 5/2006 |
| JP | 2006-311273 A | 11/2006 |
| JP | 2012-235402 A | 11/2012 |
| JP | 2013-98744 A | 5/2013 |
| JP | 2015-056756 A | 3/2015 |

* cited by examiner

Freq.(700MHz to 900MHz)

Freq.(1.7GHz to 2.7GHz)

Freq.(700MHz to 900MHz)

Freq.(1.7GHz to 2.7GHz)

Freq.(700MHz to 900MHz)

Freq.(1.7GHz to 2.7GHz)

Freq.(700MHz to 3.0GHz)

Freq.(700MHz to 3.0GHz)

Freq.(700MHz to 3.0GHz)

Freq.(700MHz to 900MHz)

Freq.(1.71GHz to 2.69GHz)

Freq.(700MHz to 900MHz)

Freq.(1.71GHz to 2.69GHz)

PHASE SHIFTER, IMPEDANCE MATCHING CIRCUIT, MULTI/DEMULTIPLEXER, AND COMMUNICATION TERMINAL APPARATUS

CROSS REFERENCE TO RELATED APPLICATIONS

This application claims the benefit of priority to Japanese Patent Application No. 2015-215081 filed on Oct. 30, 2015, Japanese Patent Application No. 2015-157569 filed on Aug. 7, 2015, and Japanese Patent Application No. 2015-062274 filed on Mar. 25, 2015, and is a Continuation Application of PCT Application No. PCT/JP2016/057914 filed on Mar. 14, 2016. The entire contents of each application are hereby incorporated herein by reference.

BACKGROUND OF THE INVENTION

1. Field of the Invention

The present invention relates to a phase shifter provided in a high-frequency circuit, and particularly to a phase shifter that shifts a phase in accordance with a frequency band. The present invention also relates to an impedance matching circuit, and particularly to an impedance matching circuit including a phase shifter. The present invention also relates to a multi/demultiplexer, and particularly to a multi/demultiplexer including a phase shifter. The present invention also relates to a communication terminal apparatus including the phase shifter, the impedance matching circuit, or the multi/demultiplexer.

2. Description of the Related Art

In general, in a high-frequency circuit, a phase shifter may be used for impedance matching. In the related art, the phase shifter may be of a high-pass-filter type or a low-pass-filter type, and a circuit constant is determined to obtain a desired phase-shift amount at a desired frequency. For example, a phase shifter including a high-pass-filter-type circuit and a low-pass-filter-type circuit is disclosed in Japanese Unexamined Patent Application Publication No. 2013-98744.

In communication terminal apparatuses and the like typified by a mobile phone terminal, for example, impedance matching is often necessary in a plurality of frequency bands. Considering the case where, as illustrated in FIG. 34, a phase shifter 73 is provided between an impedance matching circuit 72 and a second high-frequency circuit 74 and where impedance matching is performed between a first high-frequency circuit 71 and the second high-frequency circuit 74 by using the phase shifter 73 and the impedance matching circuit 72, for example, the phase shifter is required to have a phase-shift characteristic in accordance with a frequency band in order to perform impedance matching in a plurality of frequency bands.

For example, if impedance matching is performed in both the low band and the high band, it may be necessary to largely shift the phase of one of the bands while the phase of the other band is almost not shifted. There are two phase-shift operations as follows, for example.

(1) The phase of a high-band signal is shifted while the phase of a low-band signal is not shifted.

For example, the pass phase of the low-band signal is about 0° (or 180°), and the pass phase of the high-band signal is about 90°.

(2) The phase of a low-band signal is shifted while the phase of a high-band signal is not shifted.

For example, the pass phase of the low-band signal is about 90°, and the pass phase of the high-band signal is about 0° or 180°.

Note that in FIG. 34, since the reflected wave from the second high-frequency circuit 74 makes a round trip in the phase shifter 73 when seen from the impedance matching circuit 72, the phase-shift amount of the reflected signal in the phase shifter 73 doubles. That is, a phase-shift amount of 90° is necessary in order to obtain a reflected phase of 180°, and a phase-shift amount of 0° or 180° is necessary in order to obtain a reflected phase of 0°.

However, as follows, the related art has not provided a phase shifter that enables phase-shift operations for each frequency band described in the above (1) and (2).

For example, FIG. 31 illustrates an example of a phase-frequency characteristic of a high-pass-filter-type phase shifter illustrated in FIG. 30A. In this example, the phase-shift amount in a low band (700 MHz band) can be 90°, but the phase-shift amount in a high band (2 GHz band) is 30°, not 0°. In addition, FIG. 32 illustrates an example of a phase-frequency characteristic of a low-pass-filter-type phase shifter illustrated in FIG. 30B. In this example, the phase-shift amount in a low band (700 MHz band) can be −90°, but the phase-shift amount in a high band (2 GHz band) is about 100°, not 180°. Furthermore, in both the low band and the high band, the change in the phase-shift amount in the frequency band is large.

FIG. 33 illustrates an example of an insertion-loss characteristic with respect to the phase of the high-pass-filter-type phase shifter illustrated in FIG. 30A. Since the phase-shift amount is 180° around the cut-off frequency, the insertion loss is increased if the phase-shift amount is increased. In addition, in the low-pass-filter-type phase shifter illustrated in FIG. 30B, if a phase-shift amount of about 180° is obtained in a low band, the cut-off frequency is decreased, and the insertion loss in a high band is excessively increased.

As described above, in the filter-type phase shifters of the related art, it has not been possible to perform phase-shift operations for each frequency band described in the above (1) and (2).

On the other hand, in a diplexer or multiplexer provided with filters having different frequency characteristics between a common port and a plurality of individual ports, each filter typically cannot obtain an independent characteristic.

For example, FIG. 36 is a circuit diagram of a diplexer including a high-pass filter HPF and a low-pass filter LPF. In this example, an antenna ANT is connected to a common port of the high-pass filter HPF and the low-pass filter LPF. An individual port of the high-pass filter HPF is connected to a high-band circuit, and an individual port of the low-pass filter LPF is connected to a low-band circuit. The high-pass filter HPF is formed of inductors L11 and L12 connected in shunt to the ground and a series-connected capacitor C11, and the low-pass filter LPF is formed of series-connected inductors L21 and L22 and a shunt-connected capacitor C21.

However, in such a circuit illustrated in FIG. 36, when the impedance of the inductor L11 of the high-pass filter HPF is excessively decreased in a low frequency band, the inductor L11 substantially becomes a short circuit element. Thus, the short circuit element (L11) is connected to the low-pass filter LPF, and isolation between the low-band circuit and the high-band circuit is degraded in the low frequency band.

The above-described problem, which arises in a configuration in which a short circuit substantially occurs in a filter in other frequency bands among certain use frequency bands is connected to a common port, arises similarly in not only a diplexer formed of the combination of the high-pass filter and the low-pass filter but also a multiplexer formed of the combination of a plurality of band-pass filters and the like.

SUMMARY OF THE INVENTION

Preferred embodiments of the present invention provide a phase shifter suitable for impedance matching, an impedance matching circuit including the phase shifter, a multi/demultiplexer in which interference between a plurality of filters is significantly reduced or prevented, and a communication terminal apparatus including the phase shifter or the multi/demultiplexer.

A phase shifter according to a preferred embodiment of the present invention includes a transformer connected between a first port and a second port and including a first coil and a second coil that is magnetically coupled to the first coil, the transformer including a parasitic inductance component, and an impedance adjustment circuit including a reactance element that suppresses a deviation in impedance due to the parasitic inductance component of the transformer, wherein a coupling coefficient between the first coil and the second coil of the transformer and a value of the reactance element of the impedance adjustment circuit are determined such that a phase-shift amount changes in accordance with a frequency band.

With the above-described configuration combined with an impedance matching circuit, for example, it becomes easy to perform impedance matching in accordance with the frequency band.

A phase shifter according to a preferred embodiment of the present invention includes a transformer connected between a first port and a second port and including a first coil and a second coil that is magnetically coupled to the first coil, the transformer including a parasitic inductance component, and an impedance adjustment circuit including a reactance element that suppresses a deviation in impedance due to the parasitic inductance component of the transformer, wherein a coupling coefficient between the first coil and the second coil of the transformer and a value of the reactance element of the impedance adjustment circuit are determined such that a phase-shift amount in a low band is greater than a phase-shift amount in a high band, that the phase-shift amount in the low band is closer to 180° than 90°, and that the phase-shift amount in the high band is closer to 90° than 180°.

By decreasing the difference in impedance between the low band and the high band by using the above-described configuration, it becomes easy to perform impedance matching in accordance with the frequency band.

A phase shifter according to a preferred embodiment of the present invention includes a transformer connected between a first port and a second port and including a first coil and a second coil that is magnetically coupled to the first coil, the transformer including a parasitic inductance component, and an impedance adjustment circuit including a reactance element that suppresses a deviation in impedance due to the parasitic inductance component of the transformer, wherein a coupling coefficient between the first coil and the second coil of the transformer and a value of the reactance element of the impedance adjustment circuit are determined such that a phase-shift amount in a low band is greater than a phase-shift amount in a high band, that the phase-shift amount in the low band is closer to 90° than 0°, and that the phase-shift amount in the high band is closer to 0° than 90°.

With the above-described configuration combined with an impedance matching circuit including a transformer, it becomes easy to preform impedance matching in accordance with the frequency band.

It is preferable that the impedance adjustment circuit include a first capacitance element connected between the first port connected to the transformer and a ground, a second capacitance element connected between the second port connected to the transformer and the ground, and a third capacitance element connected between the first port and the second port connected to the transformer.

With the above-described configuration, although the impedance of the transformer becomes different from a predetermined value (i.e., about 50Ω) in the presence of a parallel parasitic inductance component and a series parasitic inductance component contained in the transformer, by including the reactance element (capacitance elements), the impedance is able to be adjusted.

It is preferable that the impedance adjustment circuit include a first capacitance element connected between the first port connected to the transformer and a ground, a second capacitance element connected between the second port connected to the transformer and the ground, and a series circuit including a third capacitance element and an inductance element, the series circuit being connected between the first port and the second port connected to the transformer.

With the above-described configuration, it becomes possible for the series circuit including the third capacitance element and the inductance element to have a predetermined frequency characteristic of the phase-shift amount to obtain a predetermined phase-shift amount in accordance with the frequency in a wide frequency band. In addition, although the impedance of the transformer becomes different from the predetermined value (i.e., about 50Ω) in the presence of the parallel parasitic inductance component and the series parasitic inductance component contained in the transformer, by including the first capacitance element, the second capacitance element, the third capacitance element, and the inductance element, the impedance is able to be adjusted.

It is preferable that the third capacitance element be mainly defined by a capacitance between the first coil and the second coil. Accordingly, a pattern for the formation of the third capacitance element or the third capacitance element as a component is unnecessary, thus reducing the size and cost.

Is preferable that the first capacitance element be mainly defined by a capacitance between wires of the first coil, and that the second capacitance element be mainly defined by a capacitance between wires of the second coil. Accordingly, a pattern for the formation of the first capacitance element and the second capacitance element or the first capacitance element and the second capacitance element as components are unnecessary, thus reducing the size and cost.

It is preferable that a transformer ratio between the first coil and the second coil be 1:n (where n is a value other than 1), and that a phase-shift amount of the phase shifter be moved toward a center of a Smith chart by a reflection coefficient (impedance) being moved from a high-impedance side to a low-impedance side on the Smith chart and impedance conversion by the phase shifter.

With the above-described configuration, it becomes possible to shift the phase and to perform impedance conversion by using the transformer, and it becomes possible to have a function of an impedance matching circuit between a circuit connected to the first port and a circuit connected to the second port.

It is preferable that the transformer be provided in a single stack in which a plurality of base layers are stacked and that the first coil and the second coil be defined by conductor patterns provided on the base layers. Accordingly, it becomes easy to mount a phase shifter as a single component on a communication terminal apparatus or the like because the phase shifter may be mounted on a printed wiring board or the like.

It is preferable that the first coil and the second coil have the same or substantially the same inside diameter and the same or substantially the same outside diameter and have co-axial coil winding axes. Accordingly, although the first coil and the second coil have a small number of turns, that is, although the first coil and the second coil are small, a transformer with an appropriate coupling coefficient is able to be obtained.

It is preferable that a high-pass filter or a low-pass filter connected in series to the phase shifter be further included. Accordingly, it becomes possible to determine a phase-shift amount that cannot be obtained by using only the phase shifter.

It is preferable that the high-pass filter or the low-pass filter include a capacitance element and an inductance element, the inductance element being magnetically coupled to the first coil or the second coil. With this configuration, it becomes possible to control the frequency characteristic of the phase-shift amount.

An impedance matching circuit according to a preferred embodiment of the present invention includes the phase shifter according to any one of the preferred embodiments of the present invention described above, and an impedance matching circuit that is connected in series to the phase shifter, wherein the impedance matching circuit is a circuit that provides impedance matching of an impedance whose phase has been shifted by the phase shifter.

It is preferable that the phase shifter move the impedance in a low band to a second quadrant or a third quadrant on a Smith chart, and that the impedance matching circuit move both impedance in a high band and the impedance in the low band toward a center of the Smith chart.

With any of the configurations of the impedance matching circuit described above, it becomes easy to perform impedance matching in accordance with the frequency band.

A multi/demultiplexer according to a preferred embodiment of the present invention includes a phase shifter according to any one of the above-described preferred embodiments of the present invention, a high-pass filter that performs high-band passing, and a low-pass filter that performs low-band passing, wherein the high-pass filter includes a shunt-connected first inductor between a signal line and a ground and a first capacitor connected in series in a following stage of the first inductor, the low-pass filter includes a second inductor connected in series to a common port and a second capacitor connected in shunt to the ground in a following stage of the second inductor, the phase shifter is between the common port and the first inductor, and the phase shifter shifts a phase such that the high-pass filter is substantially (equivalently) open in a pass frequency band of the low-pass filter seen from the common port.

With the above-described configuration, isolation between ports in a low band is maintained without being affected by the high-pass filter in the use frequency band (low frequency band) of the low-pass filter.

A multi/demultiplexer according to a preferred embodiment of the present invention includes a phase shifter according to any one of the above-described preferred embodiments of the present invention, and a plurality of SAW (surface acoustic wave) filters including a first SAW filter and a second SAW filter with mutually different pass frequency bands, the first SAW filter and the second SAW filter each including a first port and a second port, wherein the first port of the first SAW filter is connected to a common port via the phase shifter, and the second port of the first SAW filter is connected to an individual port, and the phase shifter shifts a phase such that the first SAW filter is substantially (equivalently) open in a pass frequency band of the second SAW filter seen from the common port.

With the above-described configuration, isolation between the first SAW filter and the second SAW filter is maintained in the use frequency band of the second SAW filter without being affected by the first SAW filter in the use frequency band of the second SAW filter.

A communication terminal apparatus according to a preferred embodiment of the present invention includes a feeder circuit and an antenna connected to the feeder circuit, wherein, between the feeder circuit and the antenna, a phase shifter according to any one of the above-described preferred embodiments of the present invention, an impedance matching circuit according to any one of the above-described preferred embodiments of the present invention, or a multi/demultiplexer according to any one of the above-described preferred embodiments of the present invention is provided. Accordingly, a communication terminal apparatus in which impedance matching is performed between the antenna element and the feeder circuit for each predetermined frequency band is obtained. In addition, it becomes possible to multiplex and demultiplex signals with a plurality of frequency bands while maintaining isolation between ports.

According to various preferred embodiments of the present invention, a phase shifter in which the phase-shift amount in accordance with the frequency band is determined is obtained. In addition, an impedance matching circuit with which impedance matching is easily performed for each frequency band is obtained. In addition, a multi/demultiplexer in which interference between a plurality of filters is significantly reduced or prevented is obtained. In addition, a communication terminal apparatus in which impedance matching is performed between an antenna element and a feeder circuit for each predetermined frequency band is obtained. Furthermore, a communication terminal apparatus including a multi/demultiplexer in which isolation between ports is maintained is obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
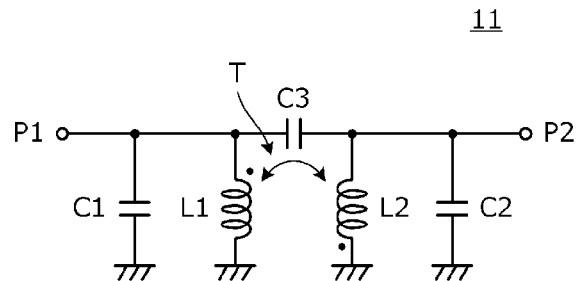
FIG. 1 is a circuit diagram of a phase shifter 11 according to a first preferred embodiment of the present invention.

Hereinafter, a plurality of preferred embodiments of the present invention will be described by taking some specific examples with reference to drawings. In the drawings, like numerals denote like components. In a second preferred embodiment and the following preferred embodiments, elements or features that are common to those in a first preferred embodiment will be omitted from description, and different elements or features will be described. In particular, like functions and effects obtained by like configurations will not be referred to in each of the preferred embodiments.

First Preferred Embodiment

FIG. 1 is a circuit diagram of a phase shifter 11 according to the first preferred embodiment. The phase shifter 11 includes a transformer T. The transformer T includes a first coil L1 and a second coil L2 that is magnetically coupled to the first coil L1 with a coupling coefficient of less than 1. The phase shifter 11 further includes an impedance adjustment circuit including a first capacitance element C1, a second capacitance element C2, and a third capacitance element C3.

The first capacitance element C1 is connected in parallel to the first coil L1, and the second capacitance element C2 is connected in parallel to the second coil L2. The third capacitance element C3 is connected between the first coil L1 and the second coil L2.

Figure 2A:
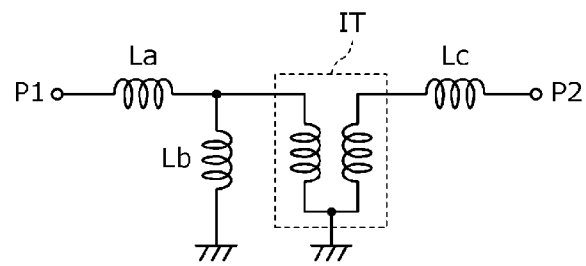
FIGS. 2A and 2B are each an equivalent circuit diagram of a transformer T.
Figure 2B:
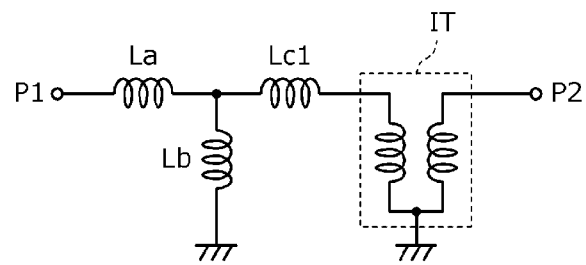

FIGS. 2A and 2B are each an equivalent circuit diagram of the transformer T. The equivalent circuit of the transformer T can be represented in several forms. FIG. 2A illustrates an ideal transformer IT, a series parasitic inductance component La that is connected in series to the upstream side of the ideal transformer IT, a parallel parasitic inductance component Lb that is connected in shunt (parallel) to the upstream side of the ideal transformer IT, and a series parasitic inductance component Lc that is connected in series to the downstream side of the ideal transformer IT.

FIG. 2B illustrates the ideal transformer IT, two series parasitic inductance components, the series parasitic inductance component La and a series parasitic inductance component Lc1, which are connected in series to the upstream side of the ideal transformer IT, and the parallel parasitic inductance component Lb that is connected in shunt (parallel) to the upstream side of the ideal transformer IT.

Here, if the transformer ratio of the transformer T is denoted by 1:n, the coupling coefficient between the first coil L1 and the second coil L2 (see FIG. 1) is denoted by k, the inductance of the first coil L1 is denoted by L1, and the inductance of the second coil L2 is denoted by L2, the inductances of the parasitic inductance components La, Lb, Lc, and Lc1 have the following relationship.

La: $L1(1-k)$
Lb: $k*L1$
Lc: $L2(1-k)$
Lc1: $n^2*L2*(1-k)$

The transformer ratio of the ideal transformer corresponds to a transformer ratio according to the number of turns of the first coil L1 and the second coil L2.

In the transformer T according to this preferred embodiment, since the coupling coefficient k between the first coil L1 and the second coil L2 is less than 1, a series inductance component and a parallel inductance component are generated.

Figure 3:
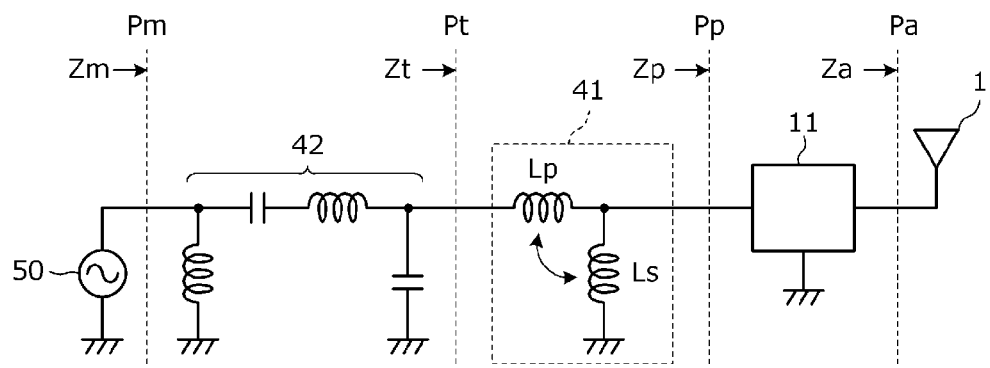
FIG. 3 illustrates a configuration of an antenna circuit including the phase shifter 11 and an antenna 1.

FIG. 3 illustrates a configuration of an antenna circuit including the phase shifter 11 and an antenna 1. This antenna circuit includes impedance matching circuits 41 and 42 and the phase shifter 11 between a feeder circuit 50 and the antenna 1. In FIG. 3, the impedance matching circuits 41 and 42 and the phase shifter 11 are examples of an "impedance matching circuit" according to a preferred embodiment of the present invention.

In FIG. 3, the phase shifter 11 shifts the phase of a reflected signal from the antenna 1 seen from the position denoted by Pa. The impedance matching circuit 41 defines an impedance conversion circuit by using a transformer. For example, the impedance matching circuit 41 increases an impedance Zt seen from the position denoted by Pt to be higher than an impedance Zp seen from the position denoted by Pp toward the antenna 1. The impedance matching circuits 41 and 42 perform impedance matching between the feeder circuit 50 and the antenna 1.

Figure 4:
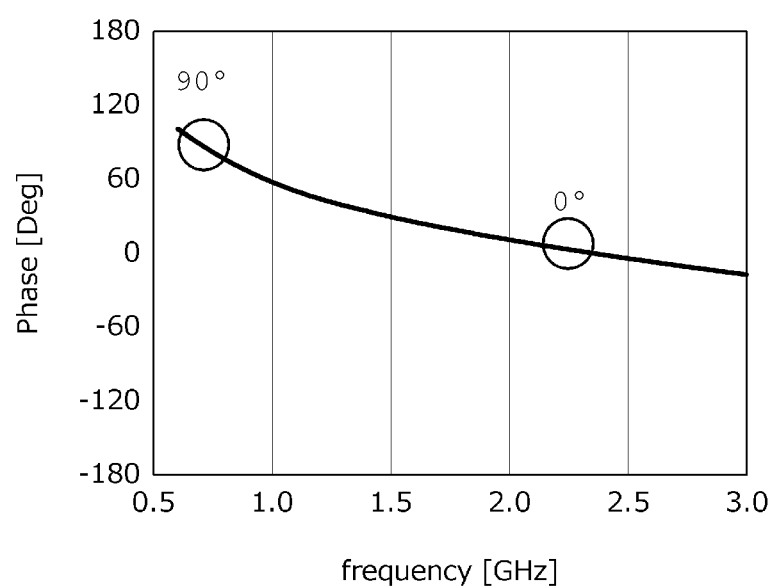
FIG. 4 illustrates a phase-shift-amount-frequency characteristic of the phase shifter 11 according to the first preferred embodiment of the present invention.

FIG. 4 illustrates a phase-shift-amount-frequency characteristic of the phase shifter 11 according to this preferred embodiment. In this example, the phase-shift amount in a low band (700 MHz to 900 MHz band) is substantially 90°, and the phase-shift amount in a high band (1.7 GHz to 2.7 GHz band) is substantially 0°. That is, this preferred embodiment illustrates an example of a phase shifter that does "not shift the phase of a high-band signal but shifts the phase of a low-band signal".

Figure 5A:
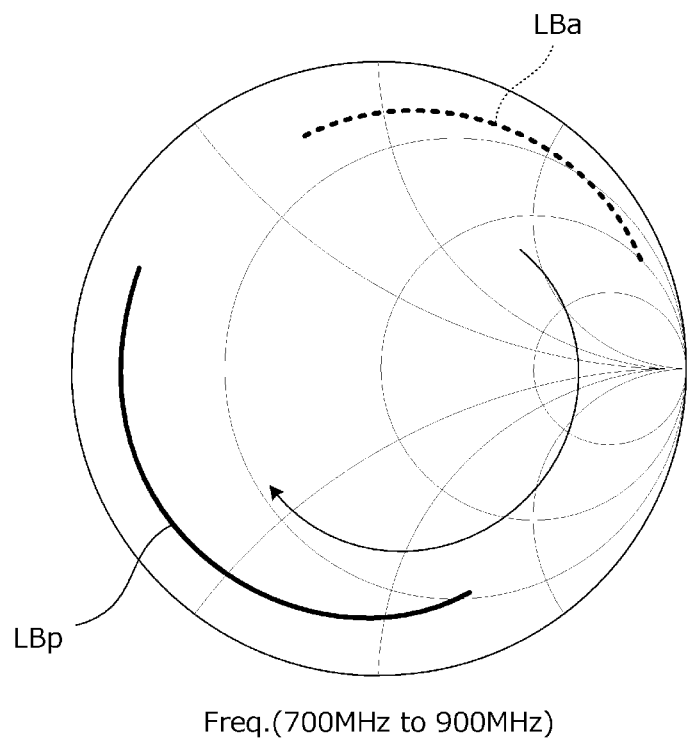
FIGS. 5A and 5B illustrate a phase-shift function of the phase shifter 11 illustrated in FIG. 3.
Figure 5B:
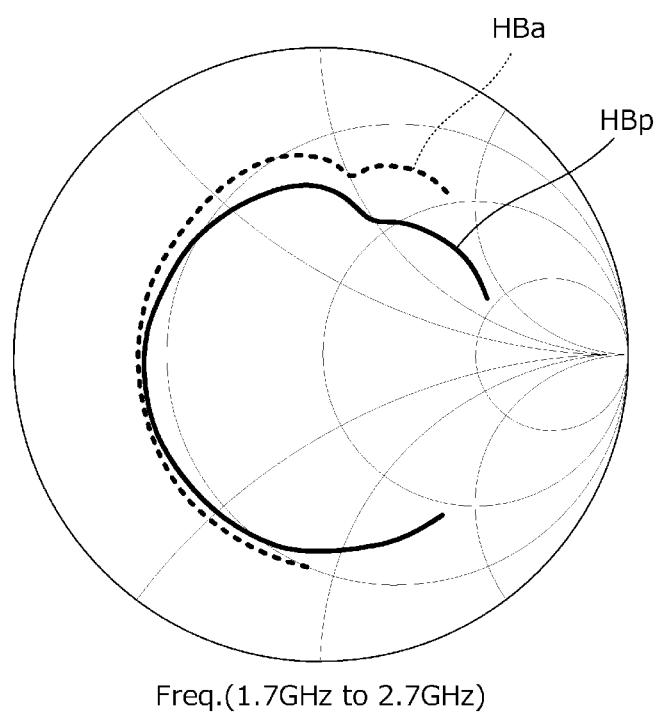

FIGS. 5A and 5B illustrate a phase-shift function of the phase shifter 11 illustrated in FIG. 3. In FIG. 5A, a locus LBa is the locus of an impedance Za illustrated in FIG. 3 in a low band, and a locus LBp is the locus of an impedance Zp illustrated in FIG. 3 in a low band. In FIG. 5B, a locus HBa is the locus of the impedance Za in a high band, and a locus HBp is the locus of the impedance Zp in a high band.

Since the phase shifter 11 shifts the phase substantially 90° in a low band as illustrated in FIG. 4, the reflected signal at the position denoted by Pp in FIG. 3 is rotated substantially 180° clockwise from the reflected signal at the position denoted by Pa. This corresponds to the impedance locus illustrated in FIG. 5A being rotated substantially 180° clockwise. Since the phase is almost not shifted in a high band, the reflected signal seen from Pp is the same or substantially the same as the reflected signal seen from Pa as illustrated in FIG. 5B. In this manner, in both the low band and the high band, a main portion (major portion) of the impedance locus is moved to the second quadrant or the third quadrant on the Smith chart. Here, "the second quadrant on the Smith chart" refers to the upper left region obtained when the Smith chart is divided into four portions in cross-shape, the region in which the real part of the reflection coefficient is negative and the imaginary part is positive. In addition, "the third quadrant on the Smith chart" refers to the lower left region obtained when the Smith chart is divided into four portions in cross-shape, the region in which the real part of the reflection coefficient is negative and the imaginary part is negative.

The impedance matching circuit 41 illustrated in FIG. 3 is a circuit of an autotransformer type including a first coil Lp and a second coil Ls that are magnetically coupled to each other. The impedance matching circuit 41 increases impedance seen from the input side at a predetermined impedance conversion ratio. Accordingly, the impedance matching circuit 41 has a function of decreasing the size of the circle of an impedance locus on a Smith chart and shifting the impedance locus clockwise.

Figure 6A:
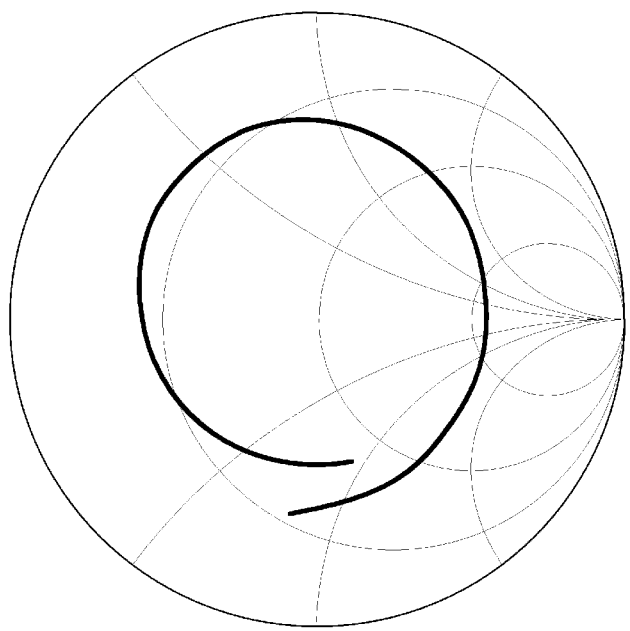
FIG. 6A illustrates a locus of an impedance Zm in FIG. 3 in a low band seen from Pm.
Figure 6B:
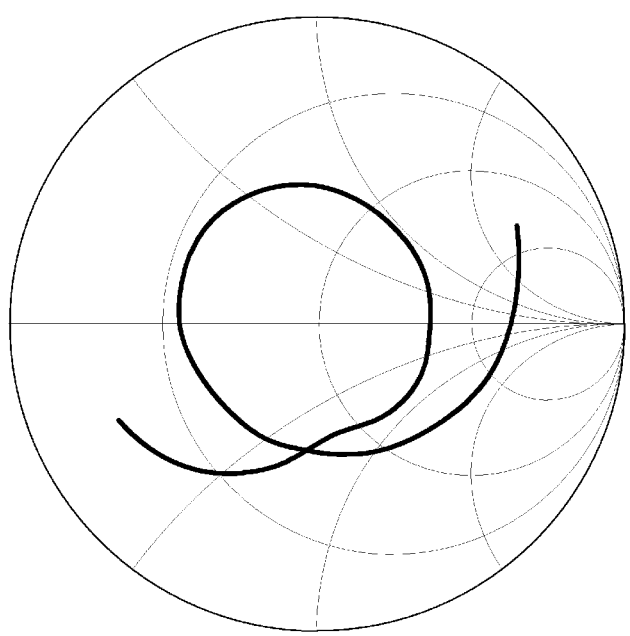
FIG. 6B illustrates a locus of the impedance Zm in a high band.
Figure 7:
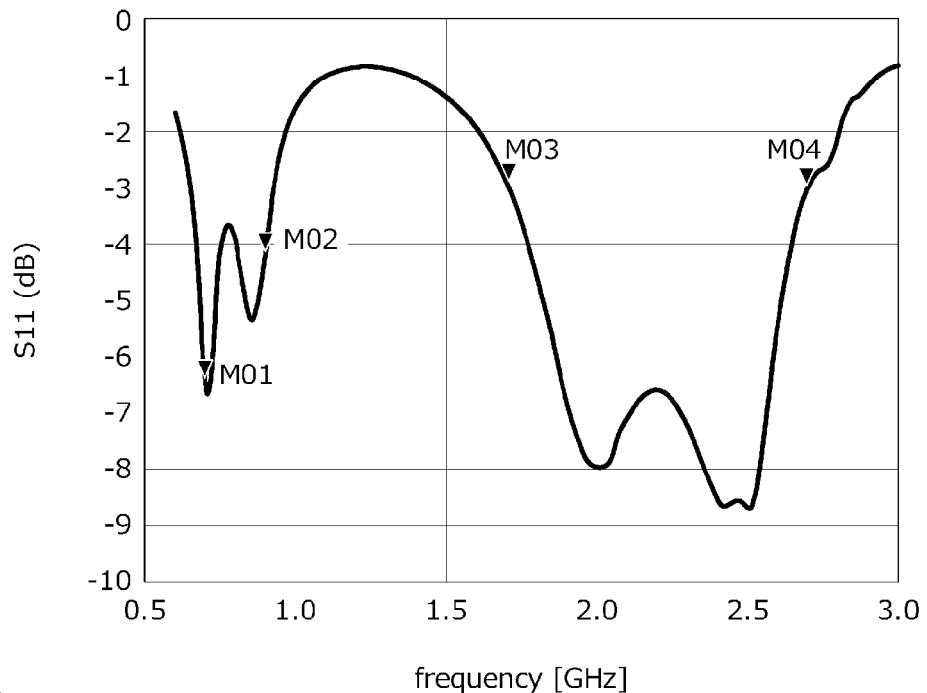
FIG. 7 illustrates a frequency characteristic of a return loss seen from Pm in FIG. 3.

FIG. 6A illustrates a locus of an impedance Zm in a low band seen from Pm in FIG. 3, and FIG. 6B illustrates a locus of the impedance Zm in a high band. In addition, FIG. 7 illustrates a frequency characteristic of a return loss seen from Pm in FIG. 3.

In this manner, in both the low band and the high band, the impedance is moved to the second quadrant or the third quadrant on a Smith chart and then is moved toward the center of the Smith chart by the impedance matching circuits 41 and 42. Thus, impedance matching is performed in both the low band and the high band.

The impedance matching circuit 42 changes the impedance mainly in a high band by using a shunt-connected (parallely connected) capacitor or a series-connected inductor and changes the impedance mainly in a low band by using a series-connected capacitor and a shunt-connected inductor.

Here, an example of matching by using a shunt-connected inductor or a shunt-connected capacitor without using a phase shifter will be described with reference to FIGS. 35A, 35B, 35C, and 35D.

Figure 35A:
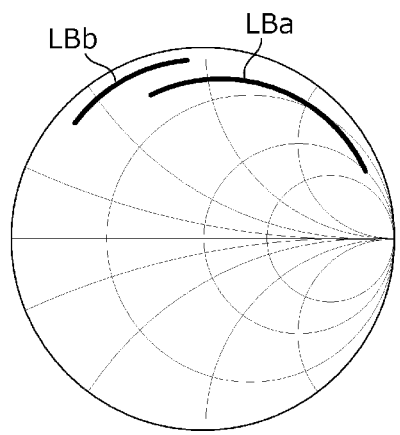
FIGS. 35A, 35B, 35C, and 35D each illustrate displacement of an impedance locus in the case where matching is to be performed by a method of the related art without using the phase shifter.
Figure 35B:
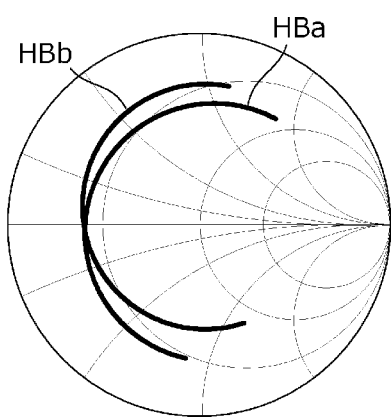
Figure 35C:
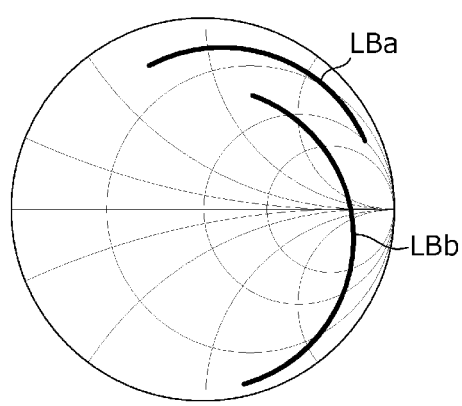
Figure 35D:
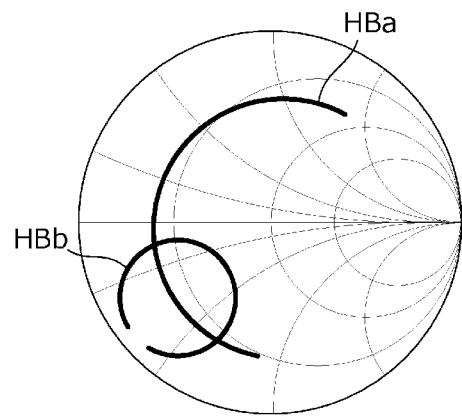
Figure 36:
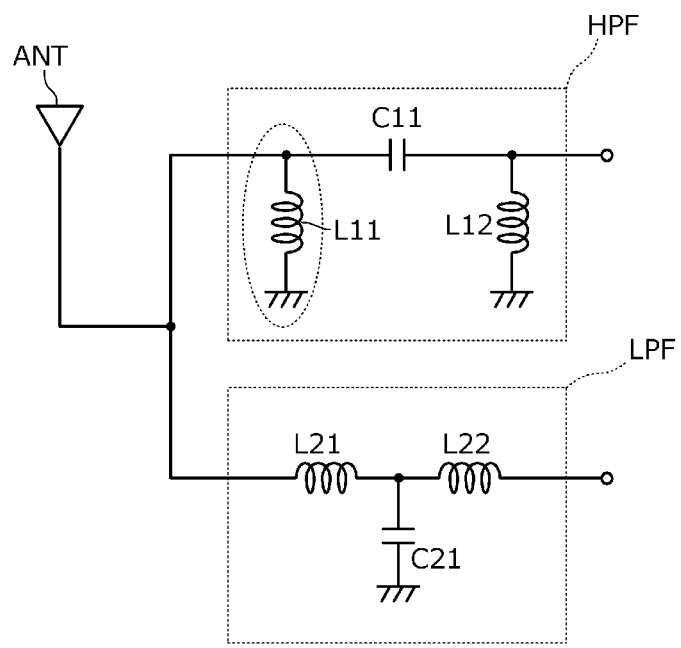
FIG. 36 is a circuit diagram of a diplexer including a high-pass filter HPF and a low-pass filter LPF.

A locus LBa in FIGS. 35A and 35C is the locus of the impedance Za illustrated in FIG. 3 in a low band, and a locus HBa in FIGS. 35B and 35D is the locus of the impedance Za illustrated in FIG. 3 in a high band. A locus LBb in FIG. 35A is the locus in a low band obtained when a shunt-connected inductor is provided, and a locus HBb in FIG. 35B is the locus in a low band obtained when a shunt-connected inductor is provided. The locus LBb in FIG. 35C is the locus in a low band obtained when a shunt-connected capacitor is provided, and the locus HBb in FIG. 35D is the locus in a high band obtained when a shunt-connected capacitor is provided.

As is clear from FIG. 35A, in the low band where the impedance locus is in the first quadrant on the Smith chart, matching cannot be performed even if a shunt-connected inductor is provided. In addition, as is clear from FIGS. 35A and 35D, in the low band where the impedance locus is in the first quadrant on the Smith chart, matching is not performed in the high band because, although a shunt-connected capacitor is able to perform matching, the shunt-connected capacitor is highly affected in the high band.

As described above, according to this preferred embodiment, matching is performed in both the low band and the high band as illustrated in FIGS. 6A and 6B.

Second Preferred Embodiment

The second preferred embodiment will describe a specific configuration example in the phase shifter 11.

Figure 8:
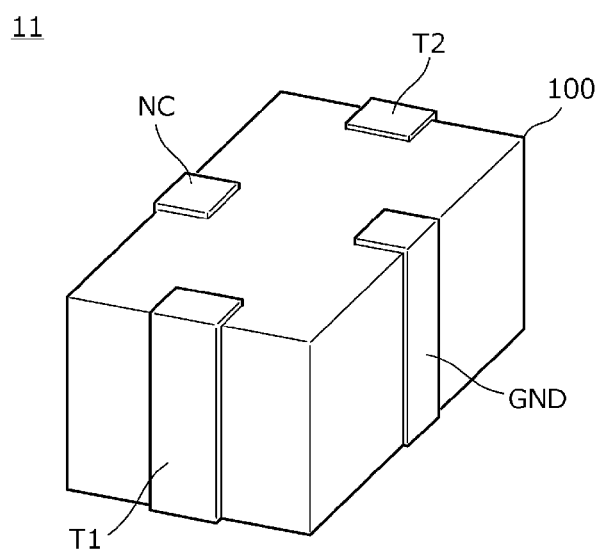
FIG. 8 is an external appearance perspective view of the phase shifter 11.
Figure 9:
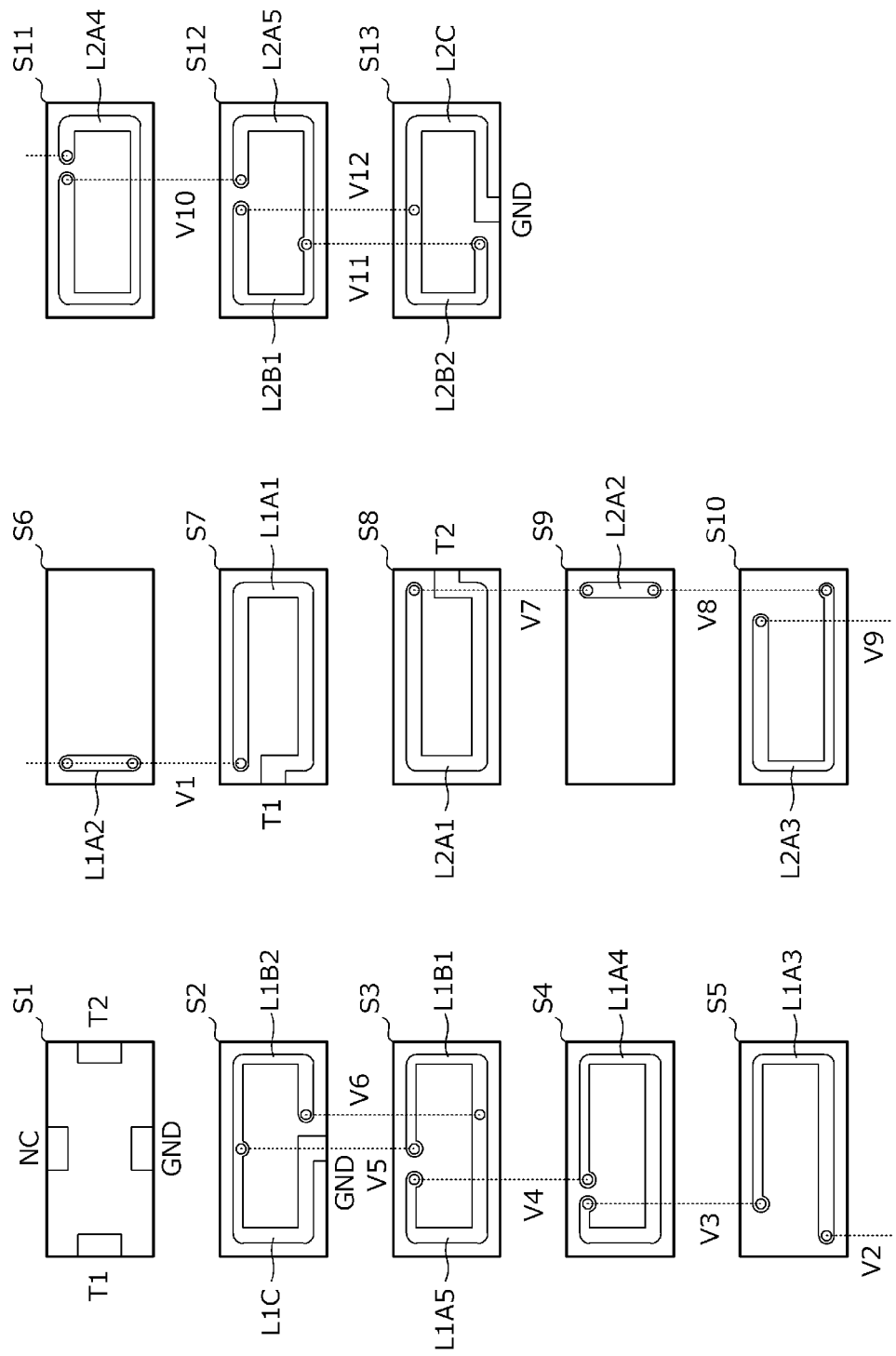
FIG. 9 is a plan view of each layer in the phase shifter 11.
Figure 10:
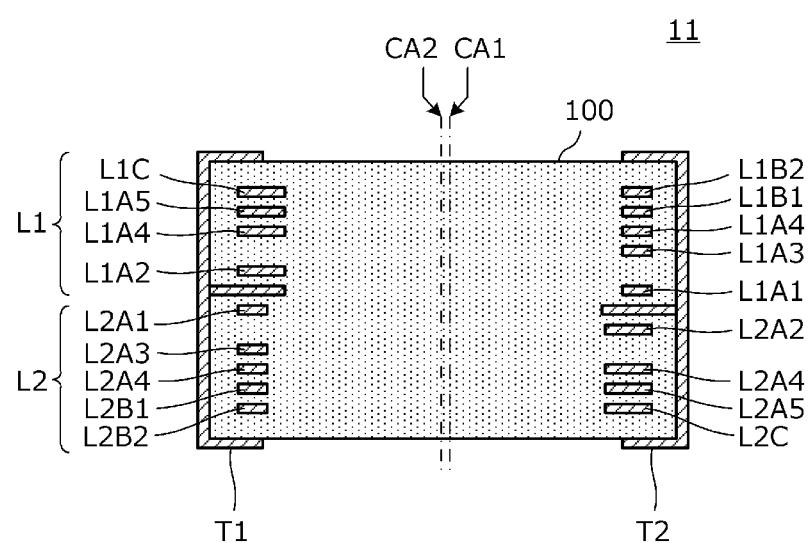
FIG. 10 is a cross-sectional view of the phase shifter 11.

FIG. 8 is an external appearance perspective view of the phase shifter 11, and FIG. 9 is a plan view of each layer in the phase shifter 11. FIG. 10 is a cross-sectional view of the phase shifter 11. The phase shifter 11 includes a plurality of insulating bases S1 to S13. Various conductor patterns are provided on the bases S1 to S13. The phrase "various conductor patterns" refers to, not only a conductor pattern provided on the surface of the base, but also an interlayer connecting conductor. The interlayer connecting conductor includes, not only a via-conductor, but also an end-surface electrode provided on an end surface of a stack 100.

The top surface of the base S1 corresponds to a surface (bottom surface) on which the stack 100 is mounted. On the base S1, a terminal T1 as a first port P1, a terminal T2 as a second port P2, a ground terminal GND, and an open terminal NC are provided.

On the bases S7, S6, S5, and S4, conductors L1A1, L1A2, L1A3, and L1A4 are provided, respectively. On the base S3, conductors L1A5 and L1B1 are provided. On the base S2, conductors L1B2 and L1C are provided.

A first end of the conductor L1A1 is connected to the terminal T1 defining and functioning as the first port. A second end of the conductor L1A1 is connected to a first end of the conductor L1A2 via a via-conductor V1. A second end of the conductor L1A2 is connected to a first end of the conductor L1A3 via a via-conductor V2. A second end of the conductor L1A3 is connected to a first end of the conductor L1A4 via a via-conductor V3. A second end of the conductor L1A4 is connected to a first end of the conductor L1A5 via via-conductor V4. A second end of the conductor L1A5 is connected to a first end of the conductor L1B1. The second end of the conductor L1A5 and the first end of the L1B1 are connected to a first end of the conductor L1B2 via a via-conductor V6. A second end of the conductor L1B1 is connected to a second end of the conductor L1B2 via a via-conductor V5. The second end of the conductor L1B2 is connected to a first end of the conductor L1C. A second end of the conductor L1C is connected to the ground terminal GND.

On the bases S8, S9, S10, and S11, conductors L2A1, L2A2, L2A3, and L2A4 are provided, respectively. On the base S12, conductors L2A5 and L2B1 are provided. On the base S13, conductors L2B2 and L2C are provided.

A first end of the conductor L2A1 is connected to the terminal T2 defining and functioning as the second port. A second end of the conductor L2A1 is connected to a first end of the conductor L2A2 via a via-conductor V7. A second end of the conductor L2A2 is connected to a first end of the conductor L2A3 via a via-conductor V8. A second end of the conductor L2A3 is connected to a first end of the conductor L2A4 via a via-conductor V9. A second end of the conductor L2A4 is connected to a first end of the conductor L2A5 via a via-conductor V10. A second end of the conductor L2A5 is connected to a first end of the conductor L2B1. The second end of the conductor L2A5 and the first end of the conductor L2B1 are connected to a first end of the conductor L2B2 via a via-conductor V12. A second end of the conductor L2B1 is connected to a second end of the conductor L2B2 via a via-conductor V11. The second end of the conductor L2B2 is connected to a first end of the conductor L2C. A second end of the conductor L2C is connected to the ground terminal GND.

The above-described conductors L1A1, L1A2, L1A3, L1A4, L1A5, L1B1, L1B2, and L1C and via-conductors V1, V2, V3, V4, V5, and V6 define the first coil L1. The above-described conductors L2A1, L2A2, L2A3, L2A4, L2A5, L2B1, L2B2, and L2C and via-conductors V7, V8, V9, V10, V11, and V12 define the second coil L2. Both of the first coil L1 and the second coil L2 preferably are rectangular helical or substantially rectangular helical coils.

The base layers in the stack 100 may be a non-magnetic ceramic stack formed of low-temperature co-fired ceramics (LTCC) or the like or a resin stack formed of a resin material such as polyimide or a liquid crystal polymer. The base layers are preferably made of a non-magnetic material (not magnetic ferrite) as described above and thus are able to be applied to a transformer and a phase shifter having a predetermined inductance and a predetermined coupling coefficient even in a high-frequency band over a few hundreds MHz.

The above-described conductor patterns and interlayer connecting conductors are preferably made of a conductor material including Ag or Cu as a main component and having a low resistivity. If the base layers are ceramics, for example, the conductor patterns and interlayer connecting conductors are preferably formed by screen printing and firing of conductive paste including Ag or Cu as a main component. If the base layers are resin, for example, the conductor patterns and interlayer connecting conductors are preferably patterned by etching a metal foil such as an Al foil or a Cu foil.

The first coil L1 and the second coil L2 may have the same or substantially the same inside diameter and substantially the same outside diameter and the same coil winding axis CA (coaxial). However, in this preferred embodiment, a winding axis CA1 of the first coil L1 and a winding axis CA2 of the second coil L2 are slightly displaced intentionally. In this preferred embodiment, as illustrated in FIG. 9, the conductors provided on the respective bases define rectangular or substantially rectangular loops, for example. However, the conductors provided on the bases S5, S4, S3, and S2 have a smaller width in the top and right sides of the loops than in the bottom and left sides. Accordingly, the winding axis CA1 (see FIG. 10) of the first coil L1 is slightly shifted to be upper right of the center of the loop contour. In addition, the conductors provided on the bases S10, S11, S12, and S13 have a smaller width in the bottom and left sides of the loops than in the top and right sides. Accordingly, the winding axis CA2 (see FIG. 10) of the second coil L2 is slightly shifted to be lower left of the center of the loop contour. Thus, the coupling coefficient between the first coil L1 and the second coil L2 is intentionally suppressed to be low.

In addition, by providing the bases S6 and S9, the inter-layer distance between a main portion of the first coil L1 excluding the conductor L1A1 and a main portion of the second coil L2 excluding the conductor L2A1 is increased.

Thus, the coupling coefficient between the first coil L1 and the second coil L2 is also intentionally suppressed to be low.

Figure 11A:
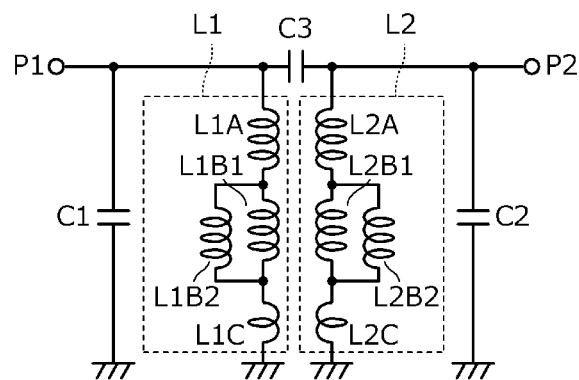
FIG. 11A is a circuit diagram of the phase shifter 11 according to a second preferred embodiment of the present invention.

FIG. 11A is a circuit diagram of the phase shifter 11 according to a preferred embodiment of the present invention. Here, a transformer is defined by the first coil L1 and the second coil L2.

The first capacitance element C1 is mainly defined by a capacitance between conductor layers provided on the bases S2, S3, S4, S5, S6, and S7. Similarly, the second capacitance element C2 is mainly defined by a capacitance between conductor layers provided on the bases S8, S9, S10, S11, S12, and S13. In addition, the third capacitance element C3 is mainly capacitance between the first coil L1 and the second coil L2, and, in particular, is mainly defined by a capacitance between the conductor L1A1 and the conductor L2A1. In this preferred embodiment, by arranging the conductor L1A1 and the conductor L2A1 to be adjacent to each other in the stacking direction, the capacitance of the third capacitance element C3 is increased.

The first coil L1 and the second coil L2 are symmetrical in the stacking direction and have the same number of turns, and accordingly define and function as a transformer having an impedance conversion ratio of 1:1.

Figure 11B:
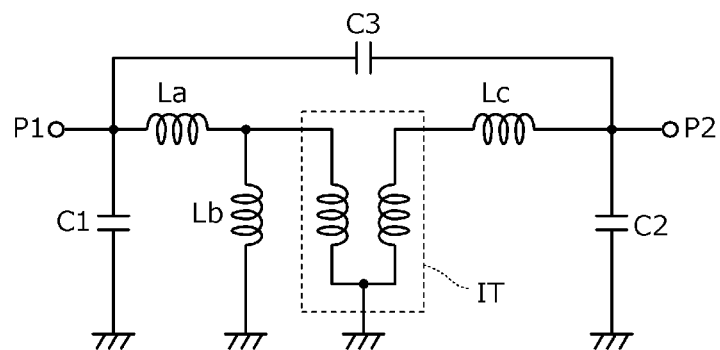
FIG. 11B is an equivalent circuit diagram illustrating the phase shifter 11 in which the ideal transformer IT and parasitic inductance components are separated from each other.

FIG. 11B is an equivalent circuit diagram illustrating the phase shifter 11 in which the ideal transformer IT and parasitic inductance components (series parasitic inductance components La and Lc and parallel parasitic inductance component Lb) are separated from each other.

Although the parasitic inductance components (inductors La, Lb, and Lc) cause the inductance of the transformer to be different from a predetermined value (e.g., about 50Ω), by including the capacitance elements C1, C2, and C3, the impedance of the transformer is adjusted to be the predetermined value. In particular, the capacitance elements C1 and C2 have a function of correcting a deviation in impedance due to the parallel parasitic inductance component Lb, and the capacitance element C3 has a function of correcting a deviation in impedance due to the series parasitic inductance components La and Lc. The above-described capacitance elements C1, C2, and C3 are each an example of a "reactance element that suppresses a deviation in impedance due to the parasitic inductance component" according to a preferred embodiment of the present invention.

As described above, because the coupling coefficient between the first coil L1 and the second coil L2 is small, the series parasitic inductance component Lc is large. However, because the capacitance of the third capacitance element C3 is also large, impedance matching is maintained. In addition, because the capacitance of the third capacitance element C3 is large, high-band signals pass through the third capacitance element C3 at a higher proportion than through the transformer defined by the first coil L1 and the second coil L2, such that a phase-shift function of the transformer is almost not performed. This is illustrated also in FIG. 5B in the first preferred embodiment. On the other hand, in a low-band, the amount that bypasses the third capacitance element C3 is relatively small, such that the phase-shift function of the transformer is performed. Note that the phase-shift amount is less than 180° because the coupling coefficient k between the first coil L1 and the second coil L2 is small. The coupling coefficient k is determined to be relatively small in order to make the phase-shift amount with respect to a low-band signal about 90°.

Note that the positions of the via-conductors V5 and V6 illustrated in FIG. 9 determine the ratio of a parallel connection portion of the conductors L1B1 and L1B2 in the first coil L1 illustrated in FIG. 11A. Similarly, the positions of the via-conductors V11 and V12 illustrated in FIG. 9 determine the ratio of a parallel connection portion of the conductors L2B1 and L2B2 in the second coil L2 illustrated in FIG. 11A. Accordingly, the inductance of the first coil L1 is able to be finely adjusted depending on the positions of the via-conductors V5 and V6, and the inductance of the second coil L2 is able to be finely adjusted depending on the positions of the via-conductors V11 and V12.

Current flows in a dispersed manner in the parallel connection portion of the conductors L1B1 and L1B2, whereas current does not disperse in this manner in the conductor L1A1. Similarly, current flows in a dispersed manner in the parallel connection portion of the conductors L2B1 and L2B2, whereas current does not disperse in this manner in the conductor L2A1.

Conductor portions of the first coil L1 and the second coil L2, the portions being close to each other in the stacking direction, contribute the most to the coupling. That is, portions of the conductors L1A1 and L2A1, which face each other in the stacking direction over the entire circumference, contribute to the coupling between the first coil L1 and the second coil L2. As described above, since current does not disperse in the conductors L1A1 and L2A1 due to the parallel connection portion, the coupling coefficient between the first coil L1 and the second coil L2 is high.

In the above manner, by providing the parallel connection portion apart from the conductor pattern of the other coil in the stacking direction, a decrease in the coupling strength caused by the provision of the parallel connection portion is significantly reduced or prevented.

In addition, by arranging the conductors L1A1 and L2A1, which are connected to the terminals T1 and T2 around the center in the stacking direction, and by arranging the conductors L1C and L2C, which are connected to the ground terminal GND, in the upper portion and the lower portion in the stacking direction, such effects are produced that it is possible to provide a transformer in which the first coil L1 and the second coil L2 share a magnetic flux without a complex configuration and to adjust the capacitance element C3 easily.

Note that, in a case where the coupling coefficient between the first coil L1 and the second coil L2 is intentionally decreased, the parallel connection portion may be provided to be close to the conductor pattern of the other coil in the stacking direction in order to use the function of decreasing the coupling strength by the provision of the parallel connection portion.

In the first and second preferred embodiments, the coupling coefficient k between the first coil L1 and the second coil L2 is decreased, and the third capacitance element C3 is increased, such that most of the high-band signals pass through the third capacitance element C3. In addition, by decreasing the coupling coefficient k between the first coil L1 and the second coil L2, the phase-shift amount of the transformer is significantly reduced or prevented. With these configurations, the phase is shifted 90° in a low band and is almost not shifted in a high band. However, the above configurations are examples. The phase-shift amount in accordance with the frequency band is able to be determined depending on the coupling coefficient k and the capacitance of the third capacitance element C3.

In addition, although the first and second preferred embodiments have described an example in which the phase-shift amount in a low band is about 90° and in which the phase-shift amount in a high band is about 0°, as a matter of course, the phase-shift amounts to be determined have a range. If it is determined that the phase-shift amount in a low band is closer to 90° than 0° and that the phase-shift amount in a high band is closer to 0° than 90°, the functions and effects described in the first and second preferred embodiments are similarly produced.

Third Preferred Embodiment

A third preferred embodiment of the present invention will describe an example of a phase shifter that does "not shift the phase of a low-band signal but shifts the phase of a high-band signal", unlike the first and second preferred embodiments. The circuit diagram of the phase shifter is the same as that illustrated in FIG. 1 in the first preferred embodiment.

Figure 12:
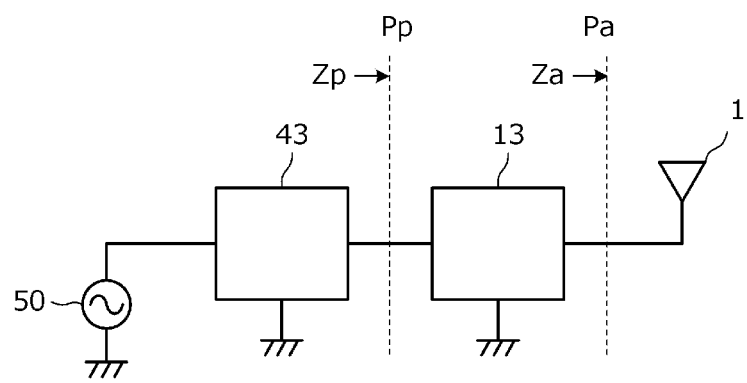
FIG. 12 illustrates a configuration of an antenna circuit including a phase shifter 13 and the antenna 1 according to a third preferred embodiment of the present invention.

FIG. 12 illustrates a configuration of an antenna circuit including a phase shifter 13 and the antenna 1 according to the third preferred embodiment. This antenna circuit includes an impedance matching circuit 43 and the phase shifter 13 between the feeder circuit 50 and the antenna 1.

In FIG. 12, the phase shifter 13 shifts the phase of a reflected signal from the antenna 1 seen from Zp. The impedance matching circuit 43 performs impedance matching between the feeder circuit 50 and the antenna 1 together with the phase shifter 13.

Figure 13:
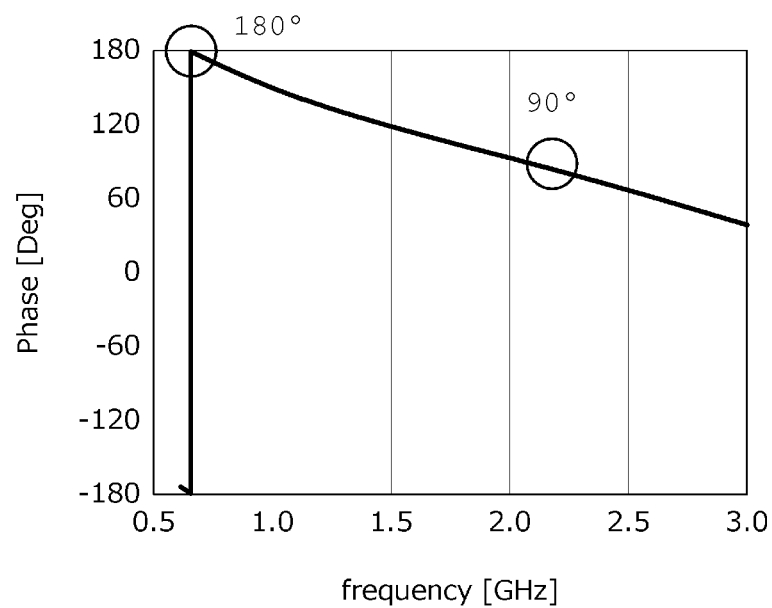
FIG. 13 illustrates a phase-shift-amount-frequency characteristic of the phase shifter 13 according to the third preferred embodiment of the present invention.

FIG. 13 illustrates a phase-shift-amount-frequency characteristic of the phase shifter 13 according to the third preferred embodiment. In this example, the phase-shift amount in a low band (700 MHz to 900 MHz band) is about 180°, and the phase-shift amount in a high band (1.7 GHz to 2.7 GHz band) is about 90°.

Figure 14A:
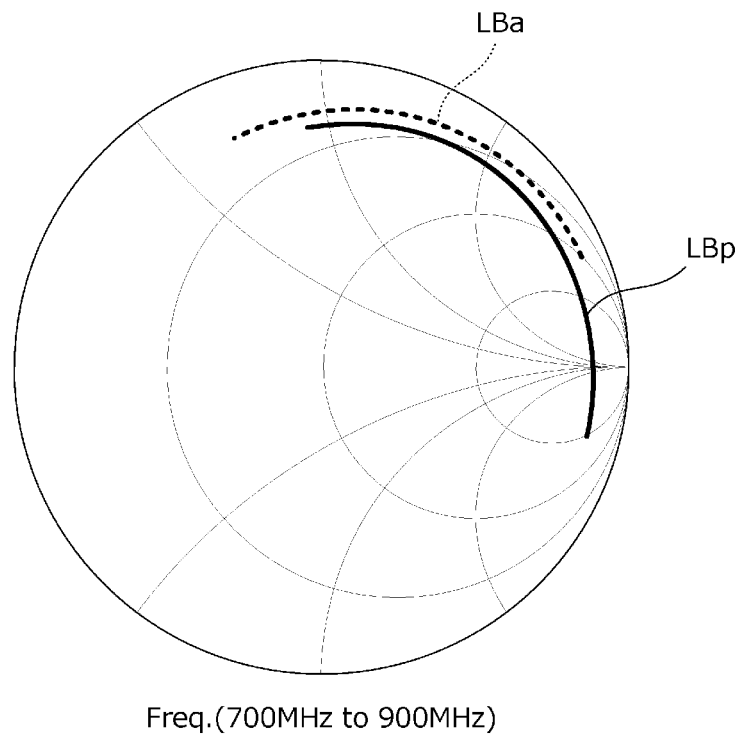
FIGS. 14A and 14B illustrate a phase-shift function of the phase shifter 13 having the characteristic illustrated in FIG. 13.
Figure 14B:
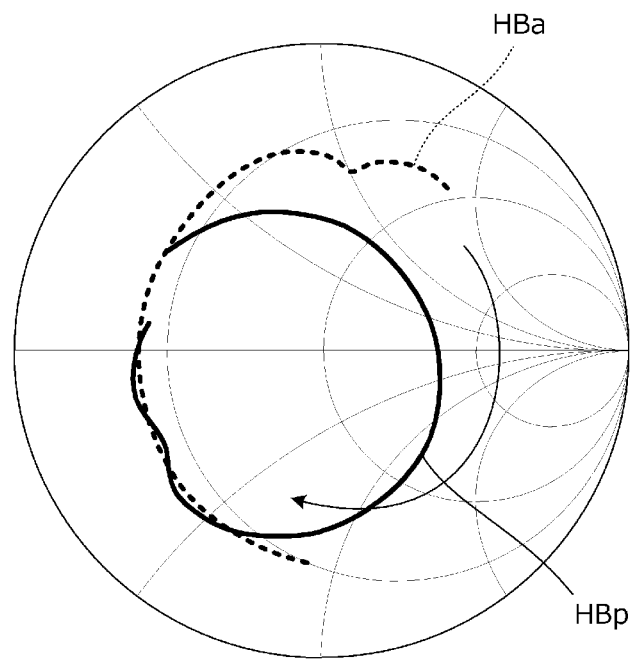

FIGS. 14A and 14B illustrate a phase-shift function of the phase shifter 13 having the characteristic illustrated in FIG. 13. The locus LBa in FIG. 14A is the locus of the impedance Za in a low band seen from Pa in FIG. 12, and the locus LBp is the locus of the impedance Zp in a low band seen from Pp in FIG. 12. The locus HBa in FIG. 14B is the locus of the impedance Za in a high band seen from Pa in FIG. 12, and the locus HBp is the locus of the impedance Zp in a high band seen from Pp in FIG. 12.

Although the coupling coefficient k between the first coil L1 and the second coil L2 is intentionally decreased in order to decrease the phase-shift amount obtained by the transformer configuration in the first and second preferred embodiments, the coupling coefficient k between the first coil L1 and the second coil L2 is made to be as close to 1 as possible in order to make the phase-shift amount obtained by the transformer configuration close to 180° in the third preferred embodiment. As illustrated in FIG. 13, the phase shifter according to this preferred embodiment shifts the phase about 180° (about 360° in round trip) in a low band, and accordingly, as illustrated in FIG. 14A, the phase of the reflected signal seen from Pp is substantially the same as the phase of the reflected signal seen from Pa. As for a high band, the phase of the reflected signal seen from Pp is rotated about 180° clockwise from the phase of the reflected signal seen from Pa. In addition, the capacitance component of the second capacitance element C2 (see FIGS. 11A and 11B) results in the impedance locus having a small circle.

In this manner, because of the phase shifter 13, the impedance in the low band is almost not moved on the Smith chart, and the impedance in the frequency band around the center is mainly on a high-impedance side. In addition, the impedance in a high frequency band around the center is moved to a high-impedance side on the Smith chart, i.e., a position close to the impedance in a low band. The impedance matching circuit 43 illustrated in FIG. 12 includes a series-connected reactance element and a shunt-connected reactance element and causes the impedance illustrated in FIGS. 14A and 14B to be matched with the impedance of the feeder circuit 50.

In the above manner, by making the impedance in a low frequency band around the center substantially the same as and the impedance in a high frequency band around the center, changes in the impedance in the transformer and the other circuit elements are able to be made to be substantially the same, thus making it easier to perform impedance matching.

The external appearance of the phase shifter 13 according to this preferred embodiment is the same as that illustrated in FIG. 8 in the second preferred embodiment.

Figure 15:
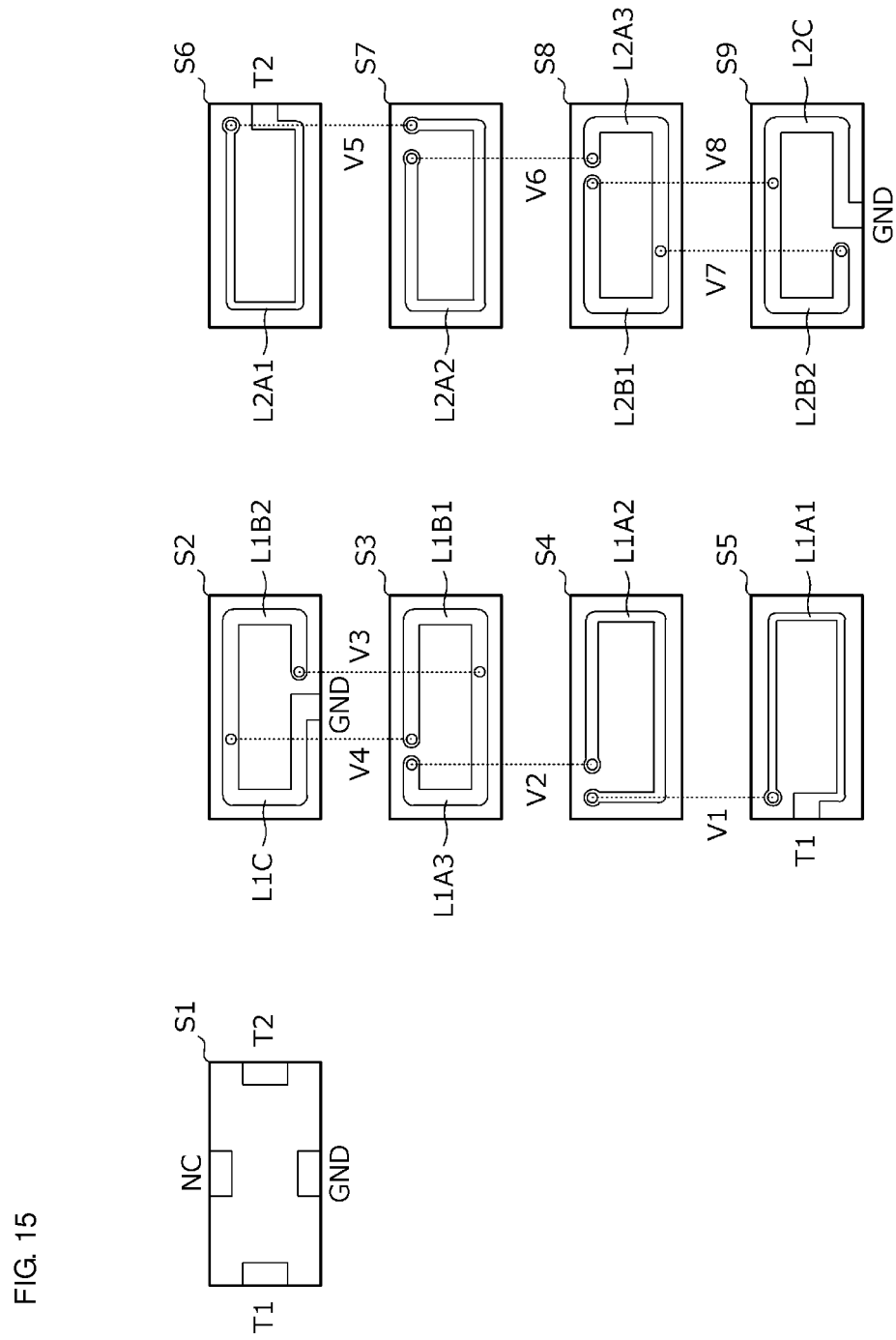
FIG. 15 is a plan view of each layer in the phase shifter according to the third preferred embodiment of the present invention.
Figure 16:
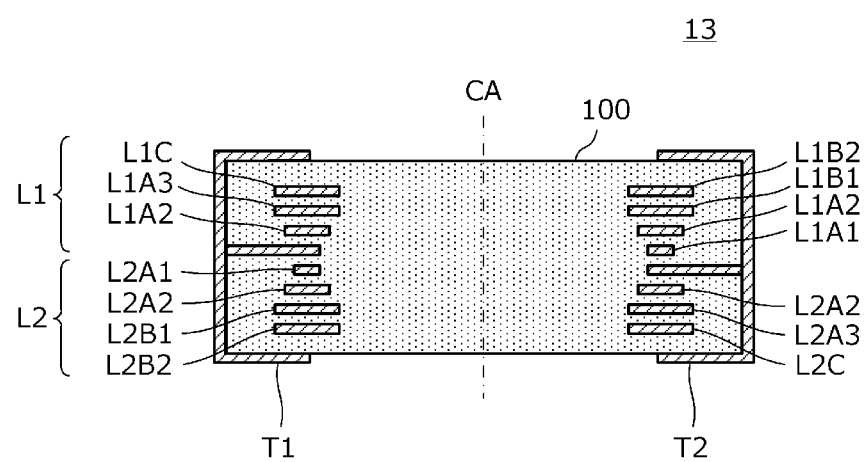
FIG. 16 is a cross-sectional view of the phase shifter 13.

FIG. 15 is a plan view of each layer in the phase shifter 13 according to this preferred embodiment. FIG. 16 is a cross-sectional view of the phase shifter 13. The circuit diagram of the phase shifter 13 is the same as that in FIG. 11A illustrated in the second preferred embodiment.

The phase shifter 13 includes the plurality of insulating bases S1 to S9. Various conductor patterns are provided on the bases S1 to S9. The phrase "various conductor patterns" refers to, not only a conductor pattern provided on the surface of the base, but also an interlayer connecting conductor. The interlayer connecting conductor includes, not only a via-conductor, but also an end-surface electrode provided on an end surface of a stack.

The top surface of the base S1 corresponds to a surface (bottom surface) on which the stack is mounted. On the base S1, the terminal T1 as the first port P1, the terminal T2 as the second port P2, the ground terminal GND, and then open terminal NC are provided.

On the bases S5 and S4, the conductors L1A1 and L1A2 are provided, respectively. On the base S3, the conductors L1A3 and L1B1 are provided. On the base S2, the conductors L1B2 and L1C are provided.

A first end of the conductor L1A1 is connected to the terminal T1 defining and functioning as the first port. A second end of the conductor L1A1 is connected to a first end of the conductor L1A2 via the via-conductor V1. A second end of the conductor L1A2 is connected to a first end of the conductor L1A3 via the via-conductor V2. A second end of the conductor L1A3 is connected to a first end of the conductor L1B1. The second end of the conductor L1A3 and the first end of the L1B1 are connected to a first end of the conductor L1B2 via the via-conductor V3. A second end of the conductor L1B1 is connected to a second end of the conductor L1B2 via the via-conductor V4. The second end of the conductor L1B2 is connected to a first end of the conductor L1C. A second end of the conductor L1C is connected to the ground terminal GND.

On the bases S6 and S7, the conductors L2A1 and L2A2 are provided, respectively. On the base S8, the conductors L2A3 and L2B1 are provided. On the base S9, the conductors L2B2 and L2C are provided.

A first end of the conductor L2A1 is connected to the terminal T2 defining and functioning as the second port. A second end of the conductor L2A1 is connected to a first end of the conductor L2A2 via the via-conductor V5. A second end of the conductor L2A2 is connected to a first end of the conductor L2A3 via the via-conductor V6. A second end of the conductor L2A3 is connected to a first end of the conductor L2B1. The second end of the conductor L2A3 and the first end of the conductor L2B1 are connected to a first end of the conductor L2B2 via the via-conductor V7. A second end of the conductor L2B1 is connected to a second end of the conductor L2B2 via the via-conductor V8. The second end of the conductor L2B2 is connected to a first end of the conductor L2C. A second end of the conductor L2C is connected to the ground terminal GND.

The above-described conductors L1A1, L1A2, L1A3, L1B1, L1B2, and L1C and via-conductors V1, V2, V3, and V4 define the first coil L1. The above-described conductors L2A1, L2A2, L2A3, L2B1, L2B2, and L2C and via-conductors V5, V6, V7, and V8 define the second coil L2. Both of the first coil L1 and the second coil L2 preferably are rectangular helical or substantially rectangular helical coils.

The conductors L1A1 and L2A1 on the bases S5 and S6 have a smaller width than the other conductors. In addition, the conductors L1A2 and L2A2 on the bases S4 and S7 have a smaller width than the conductors on the bases S3 and S8. Accordingly, the capacitance between the first coil L1 and the second coil L2 is suppressed to be low, and the capacitance of the third capacitance element C3 is suppressed to be low. In addition, in this preferred embodiment, among the conductor patterns in the plurality of layers defining the first coil L1 and the conductor patterns in the plurality of layers defining the second coil L2, the closer the conductor patterns are, the smaller the width is; and the more distant the conductor patterns are, the larger the width is. By having such a relationship, the first coil L1 and the second coil L2 do not have an excessively small narrow average width, and the capacitance between the first coil L1 and the second coil L2 is suppressed. Thus, a conductor loss is reduced, and an increase in the insertion loss is reduced.

The first coil L1 and the second coil L2 have the same or substantially the same inside diameter and the same or substantially the same outside diameter and the same coil winding axis CA (coaxial). In addition, unlike in the phase shifter 11 described in the second preferred embodiment, the inter-layer distance between the layers of the first coil L1 and the layers of the second coil L2 is close. Thus, a transformer having a high coupling coefficient k between the first coil L1 and the second coil L2 is obtained.

In addition, although this preferred embodiment has described an example in which the phase-shift amount in a low band is about 180° and in which the phase-shift amount in a high band is about 90°, as a matter of course, the phase-shift amounts to be determined have a range. If it is determined that the phase-shift amount in a low band is closer to 180° than 90° and that the phase-shift amount in a high band is closer to 90° than 180°, the functions and effects described in this preferred embodiment are produced.

Fourth Preferred Embodiment

A fourth preferred embodiment of the present invention will describe a phase shifter including a high-pass filter and a low-pass filter.

Figure 17A:
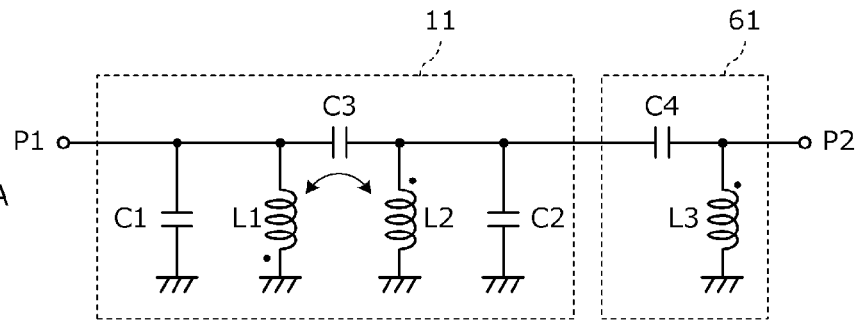
FIGS. 17A, 17B, and 17C are circuit diagrams of three phase shifters according to a fourth preferred embodiment of the present invention.
Figure 17B:
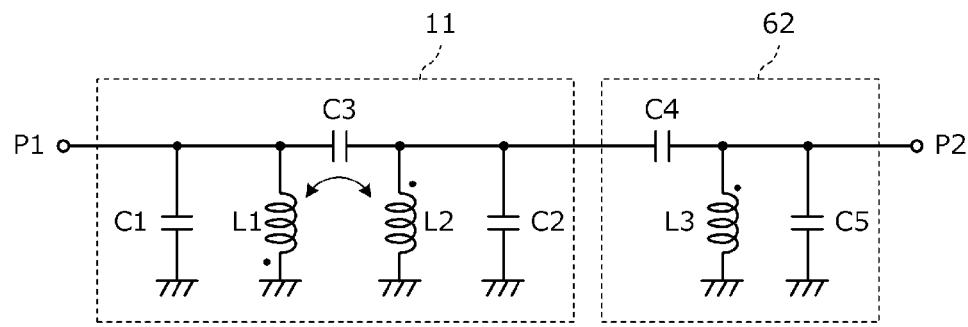
Figure 17C:
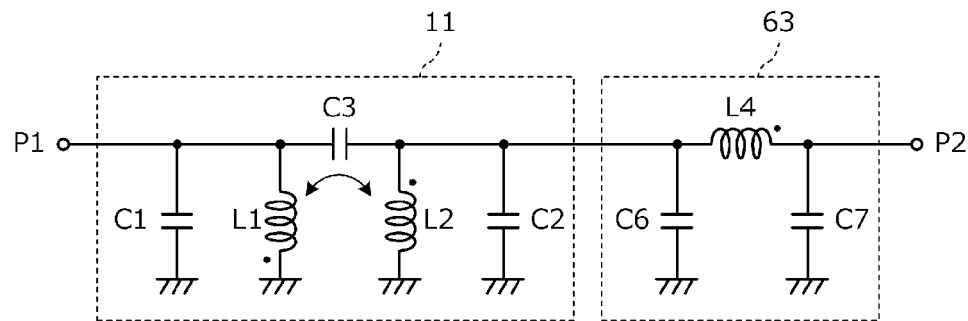

FIGS. 17A, 17B, and 17C are circuit diagrams of three phase shifters according to the fourth preferred embodiment. In the example illustrated in FIG. 17A, a high-pass filter 61 is connected in series to the phase shifter 11. The high-pass filter 61 includes a series-connected capacitance element C4 and a shunt-connected inductance element L3. In the example illustrated in FIG. 17B, a high-pass filter 62 is connected in series to the phase shifter 11. The high-pass filter 62 includes the series-connected capacitance element C4 and a parallely connected inductance element L3 and a parallely connected capacitance element C5. In the example illustrated in FIG. 17C, a low-pass filter 63 is connected in series to the phase shifter 11. The low-pass filter 63 includes a series-connected inductance element L4, a parallely connected capacitance element C6, and a parallely connected capacitance element C7.

By connecting the high-pass filter or the low-pass filter in series to the phase shifter 11 as in this preferred embodiment, if a predetermined phase-shift amount is not obtained by using only the phase shifter 11, the lacking phase-shift amount is able to be compensated for by using the high-pass filter or the low-pass filter, thus providing the phase shifter having the predetermined phase-shift amount.

For example, if the phase shifter having a transformer configuration shifts the phase 175° and the phase-shift amount is to be adjusted to 180°, the phase-shift amount is increased by 5° by using the high-pass filter that is additionally provided as illustrated in FIG. 17A. The added phase-shift amount is so small that an increase in the loss is almost not generated. Depending on the phase-shift amount to be added, a matching deviation may occur in some cases. In those cases, matching is adjusted by using the shunt-connected capacitance element C5 as illustrated in FIG. 17B. In contrast, if the phase-shift amount is to be increased, a low-pass filter is additionally provided as illustrated in FIG. 17C.

Note that the above-described inductance elements and capacitance elements may be individual components or may be defined by conductor patterns. In addition, the above-described inductance elements and capacitance elements may be formed integrally with the phase shifter 11. In the phase shifters illustrated in FIGS. 17A, 17B, and 17C, by integrally providing the inductance elements L3 and L4 in the filter with the phase shifter 11, the inductance elements L3 and L4 may be magnetically coupled to the first coil L1 and the second coil L2. Accordingly, in the examples illustrated in FIGS. 17A and 17B, the phase-shift amounts obtained by additionally providing the high-pass filters 61 and 62 may be differentiated from those in the case where the above coupling is not obtained. Similarly, in the example illustrated in FIG. 17C, the phase-shift-amount-frequency characteristic obtained by additionally providing the low-pass filter 63 may be differentiated from that in the case where the above coupling is not obtained.

Figure 18:
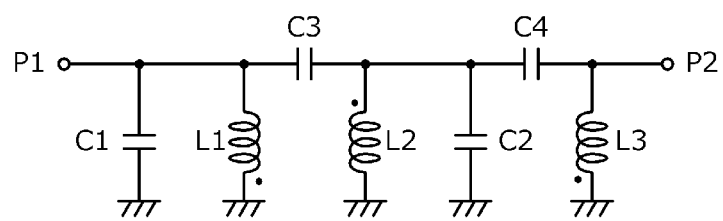
FIG. 18 is a circuit diagram of another phase shifter according to a preferred embodiment of the present invention.

FIG. 18 is a circuit diagram of another phase shifter according to this preferred embodiment. The basic configuration of the circuit is the same as that of the circuit illustrated in FIG. 17A, but the polarity of the inductance element L3 coupled to the first coil L1 and the second coil L2 is opposite to that in the circuit illustrated in FIG. 17A. With the coupling having this polarity, an increase and a decrease in the phase-shift amount obtained by additionally providing the high-pass filter 61 is also able to be adjusted. As for the circuits illustrated in FIGS. 17B and 17C, depending on the polarity of the coupled inductance elements L3 and L4, an increase and a decrease in the phase-shift amount obtained by additionally providing the high-pass filter 62 and the low-pass filter 63 is also able to be adjusted.

Fifth Preferred Embodiment

A fifth preferred embodiment of the present invention will describe an example of a phase shifter that shifts the phase and converts the impedance.

Figure 19:
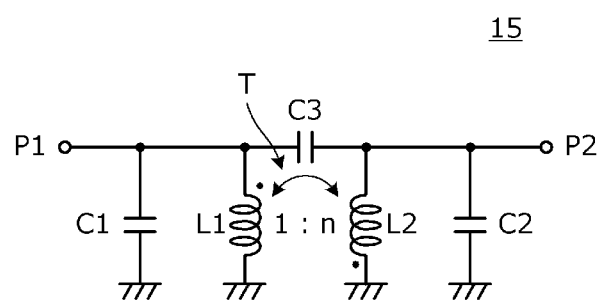
FIG. 19 is a circuit diagram of a phase shifter 15 according to a fifth preferred embodiment of the present invention.

FIG. 19 is a circuit diagram of a phase shifter 15 according to the fifth preferred embodiment. Although the first preferred embodiment has described a phase shifter including a transformer with an impedance conversion ratio of 1:1 in the examples illustrated in FIG. 1 and FIGS. 2A and 2B, the impedance conversion ratio may be 1:n (where n is a value other than 1). For example, if n<1 is satisfied, an antenna having impedance lower than the impedance of the feeder circuit is able to be matched with the impedance of the feeder circuit. Therefore, according to this preferred embodiment, it is possible to perform a predetermined phase shift and impedance matching.

Sixth Preferred Embodiment

Figure 20:
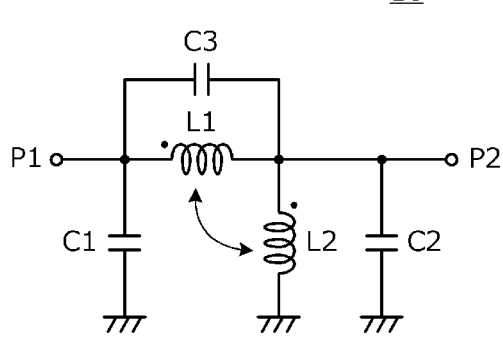
FIG. 20 is a circuit diagram of a phase shifter 16 according to a sixth preferred embodiment of the present invention.

FIG. 20 is a circuit diagram of a phase shifter 16 according to a sixth preferred embodiment of the present invention. The phase shifter 16 according to this preferred embodiment includes an autotransformer including the first coil L1 and the second coil L2 that are magnetically coupled to each other. The first capacitance element C1 is connected between the first port P1 and the ground, and the second capacitance element C2 is connected between the second port P2 and the ground. In addition, the third capacitance element C3 is connected between the first port P1 and the second port P2.

In the autotransformer such as the transformer in this preferred embodiment, since the coupling coefficient between the first coil L1 and the second coil L2 is less than 1, a parallel inductance component and a series inductance component are generated. In addition, the impedance matching is performed by using the capacitance elements C1, C2, and C3.

Seventh Preferred Embodiment

Figure 21:
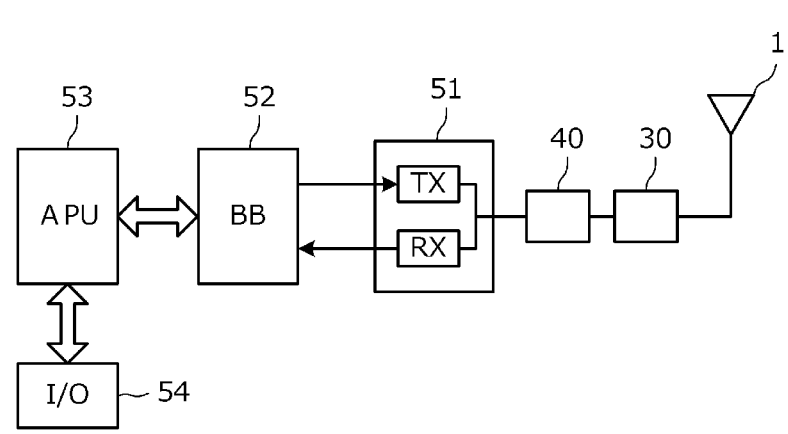
FIG. 21 is a block diagram of a communication terminal apparatus 200 according to a seventh preferred embodiment of the present invention.

A seventh preferred embodiment of the present invention will describe a communication terminal apparatus. FIG. 21 is a block diagram of a communication terminal apparatus 200 according to the seventh preferred embodiment. The communication terminal apparatus 200 according to this preferred embodiment includes the antenna 1, an antenna matching circuit 40, a phase-shift circuit 30, a communication circuit 51, a baseband circuit 52, an application processor 53, and an input/output circuit 54. The communication circuit 51 includes a transmission circuit and a reception circuit for a low band (700 MHz to 1.0 GHz) and a high band (1.4 GHz to 2.7 GHz) and an antenna duplexer, for example. The antenna 1 is a monopole antenna, an inverse L antenna, an inverse F antenna, or the like compatible with the low band and the high band.

The above-described components are preferably stored in a single housing. For example, the antenna matching circuit 40, the phase-shift circuit 30, the communication circuit 51, the baseband circuit 52, and the application processor 53 are mounted on a printed wiring board, and the printed wiring board is stored in the housing. The input/output circuit 54 is incorporated in the housing as a display and touch panel. The antenna 1 is mounted on the printed wiring board or arranged on an inner wall of the housing or inside the housing.

The communication terminal apparatus having the above-described configuration and including an antenna that performs matching in a wide band is obtained.

Eighth Preferred Embodiment

An eighth preferred embodiment of the present invention will describe a phase shifter in which the phase-shift amount has a frequency characteristic. As described in some of the above-described preferred embodiments, the transformer shifts the phase 180° but does not have a phase-shift-amount-frequency characteristic. Accordingly, it is difficult to obtain a predetermined phase-shift amount in a specific frequency band by using only the transformer or to obtain a predetermined phase-shift amount in accordance with the frequency in a frequency range.

Figure 22:
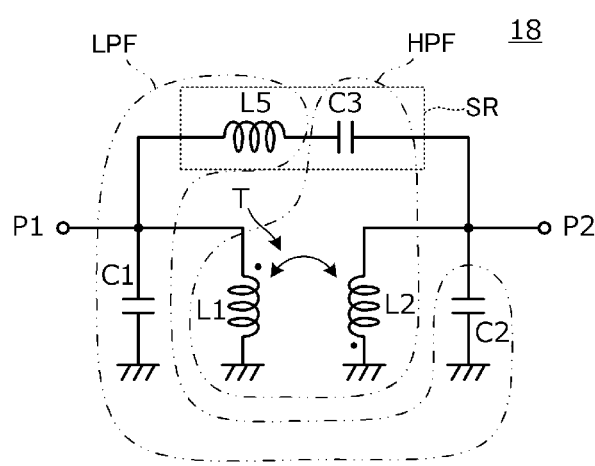
FIG. 22 is a circuit diagram of a phase shifter 18 according to an eighth preferred embodiment of the present invention.

FIG. 22 is a circuit diagram of a phase shifter 18 according to the eighth preferred embodiment. The phase shifter 18 is different from the phase shifter 11 illustrated in FIG. 1 in the first preferred embodiment in that an inductance element L5 is provided. That is, a series circuit SR including the third capacitance element C3 and the inductance element L5 is provided between the first port P1 and the second port P2 connected to the transformer T. The other basic configuration is the same as that of the phase shifter 11 according to the first preferred embodiment.

As illustrated in FIG. 22, by providing the LC series circuit SR including the third capacitance element C3 and the inductance element L5 in parallel to the transformer T (as a bypass line), the phase shifter 18 according to this preferred embodiment includes a low-pass filter portion LPF and a high-pass filter portion HPF. That is, the first capacitance element C1, the second capacitance element C2, and the inductance element L5 form the low-pass filter portion LPF, and the first coil L1, the second coil L2, and the third capacitance element C3 define the high-pass filter portion HPF. Alternatively, a parallel parasitic inductance component (see Lb in FIGS. 2A and 2B) of the transformer T including the first coil L1 and the second coil L2 and the third capacitance element C3 is able to define the high-pass filter HPF.

Figure 23:
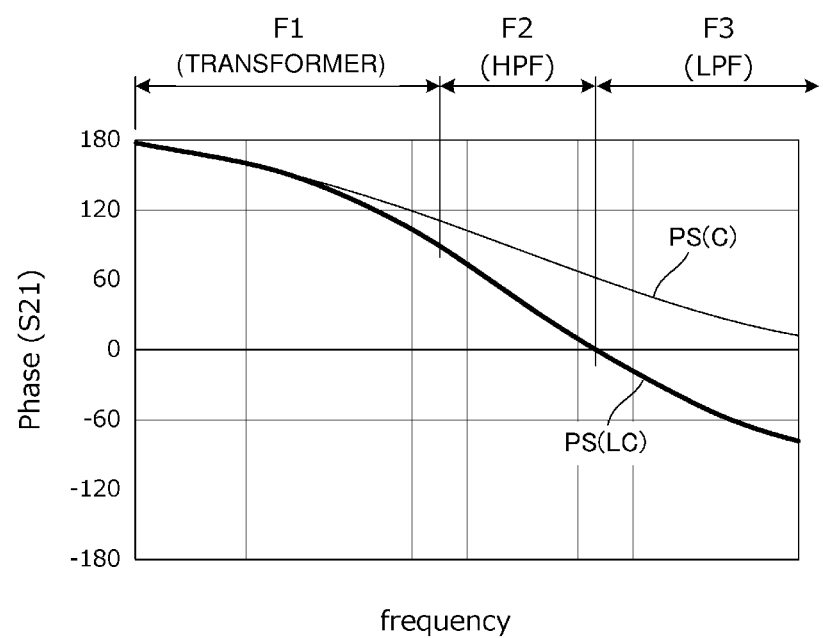
FIG. 23 illustrates a frequency characteristic of a phase-shift amount of the phase shifter 18.

FIG. 23 illustrates a frequency characteristic of each of the phase shifter 18 according to this preferred embodiment and a phase shifter according to a comparative example. In the phase shifter according to the comparative example, the inductance element L5 in FIG. 22 is not provided, and the third capacitance C3 is provided in a bypass line.

In FIG. 23, a curve PS(LC) denotes the frequency characteristic of the phase shifter 18, and a curve PSC denotes the frequency characteristic of the phase shifter according to the comparative example. The phase shifter according to the comparative example functions as a transformer-phase shifter in a low frequency band. In a high frequency band, a larger amount of signals bypasses the third capacitance element C3, and the phase-shift amount approaches 0°.

In contrast, in the phase shifter 18 according to this preferred embodiment, the phase-shift amount is negative in high frequencies. FIG. 23 illustrates functions of the phase shifter 18 according to this preferred embodiment in three frequency bands F1, F2, and F3 separately as described below.

In the low frequency band F1, the capacitance of the third capacitance element C3 is dominant in the LC series circuit SR. Accordingly, signals that travel between the ports P1 and P2 almost do not bypass through the LC series circuit SR. That is, the characteristic of the transformer T appears.

In the middle frequency band F2, the capacitance of the third capacitance element C3 is dominant over the inductance element L5 in the LC series circuit SR, and the LC series circuit SR is capacitive. Accordingly, the bypass circuit defines and functions as a high-pass filter, and the phase-shift amount is decreased with an increase in the frequency.

In the high frequency band F3, the inductance of the inductance element L5 is dominant over the third capacitance element C3 in the LC series circuit SR, and the LC series circuit SR is inductive. Accordingly, the bypass circuit defines and functions as a low-pass filter, and the phase-shift amount is negative. The frequency at which the phase-shift amount is 0° corresponds to the series resonance frequency of the LC series circuit SR.

The above-described phase-shift-amount-frequency characteristic is determined depending on the first capacitance element C1, the second capacitance element C2, the third capacitance element C3, the inductance element L5, and a parallel parasitic inductance component of the transformer T.

In the above manner, it is possible for the phase-shift amount to have a predetermined wide frequency characteristic. In addition, it is possible to obtain a predetermined phase-shift amount in accordance with the frequency in a wide frequency band.

In addition, each of the first capacitance element C1, the second capacitance element C2, the third capacitance element C3, and the inductance element L5 does not only determine the frequency characteristic of the phase-shift amount, but also has a function of an element for matching the impedance to be a predetermined impedance (typically about 50Ω).

Ninth Preferred Embodiment

A ninth preferred embodiment of the present invention will describe a diplexer including a high-pass filter, a low-pass filter, and a phase shifter. The diplexer is an example of a "multi/demultiplexer" according to a preferred embodiment of the present invention.

Figure 24A:
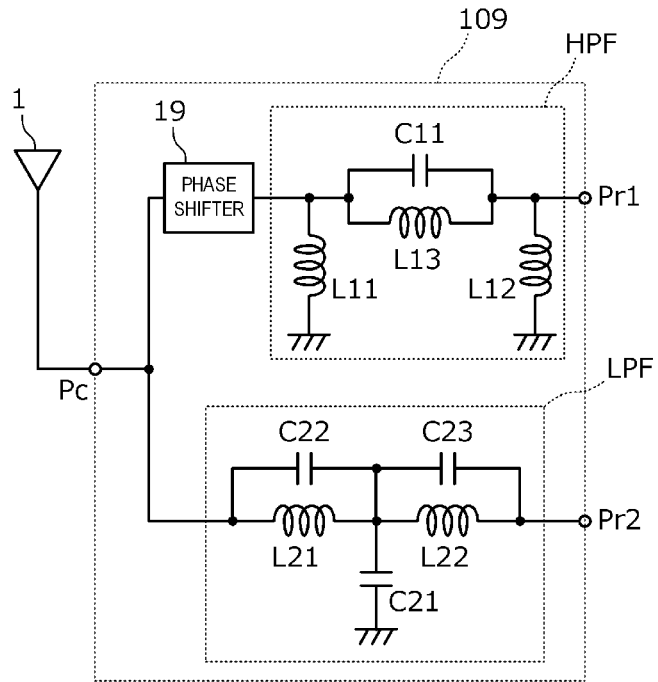
FIG. 24A is a circuit diagram illustrating a configuration of a diplexer 109 according to a ninth preferred embodiment of the present invention.

FIG. 24A is a circuit diagram illustrating a configuration of a diplexer 109 according to the ninth preferred embodiment. The diplexer 109 includes the high-pass filter HPF that performs high-band passing and the low-pass filter LPF that performs low-band passing connected between a common port Pc and each of individual ports Pr1 and Pr2. In this preferred embodiment, the antenna 1 is connected to the common port P.

The high-pass filter HPF includes a first inductor L11 connected in shunt between a signal line and the ground and a first capacitor C11 connected in series to the line in the following stage of the first inductor L11. In this preferred embodiment, the high-pass filter HPF further includes an inductor L13 connected in parallel to the first capacitor C11 and further includes a shunt-connected inductor L12 in the following stage.

The low-pass filter LPF includes a second inductor L21 connected in series to the common port Pc and a second capacitor C21 connected in shunt to the ground in the following stage of the second inductor L21. In this preferred embodiment, the low-pass filter LPF further includes a capacitor C22 connected in parallel to the second inductor L21 and further includes a series-connected parallel connection circuit including an inductor L22 and a capacitor C23 in the following stage of the shunt-connected second capacitor C21.

A phase shifter 19 is inserted between the common port Pc and the first inductor L11. The phase shifter 19 shifts the phase such that the high-pass filter HPF is substantially (equivalently) open in a pass frequency band (low band) of the low-pass filter LPF seen from the common port Pc.

Figure 24B:
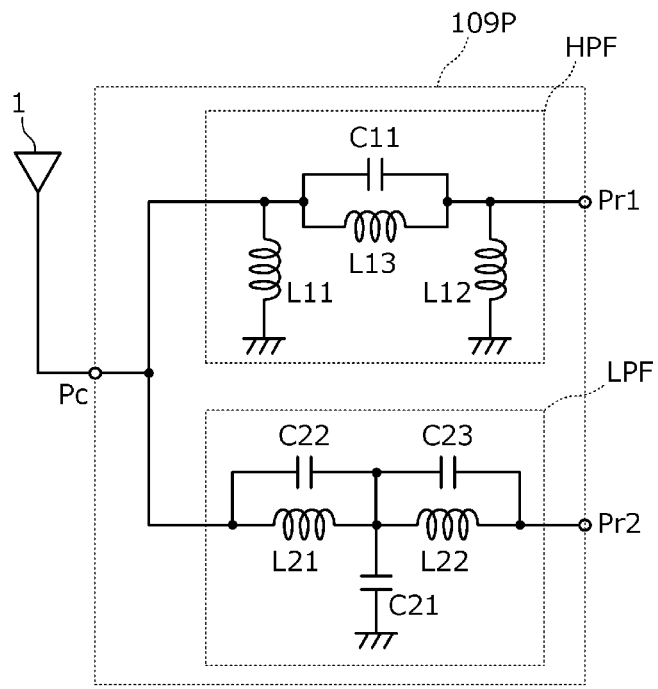
FIG. 24B is a circuit diagram of a diplexer 109P as a comparative example of the diplexer 109.

FIG. 24B is a circuit diagram of a diplexer 109P as a comparative example of the diplexer 109. Unlike the diplexer 109, the diplexer 109P does not include the phase shifter 19.

Figure 25:
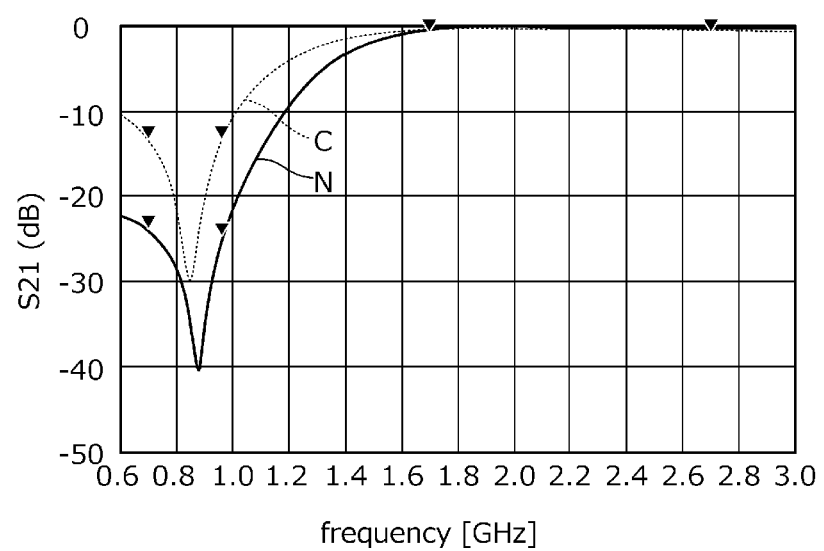
FIG. 25 illustrates an insertion-loss-frequency characteristic between ports Pr2 and Pc depending on the presence and absence of an inductor L11 in the diplexer 109P according to the comparative example.

FIG. 25 illustrates an insertion-loss-frequency characteristic between the ports Pr2 and Pc depending on the presence and absence of the inductor L11 in the diplexer 109P according to the comparative example. Here, a characteristic curve C denotes the characteristic obtained in the presence of the inductor L11, and a characteristic curve N denotes the characteristic obtained in the absence of the inductor L11.

If the inductor L11 connected in shunt to the ground and connected to the common port Pc is absent, isolation is high in a low band. However, because of the absence of the inductor L11, the high-pass filter HPF has a degraded characteristic (which will be described later).

Figure 26A:
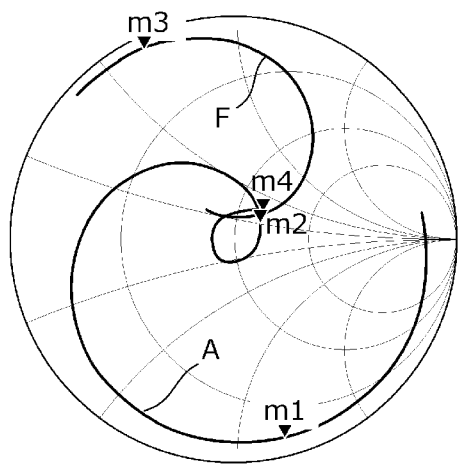
FIG. 26A illustrates, on a Smith chart, a reflection-coefficient-frequency characteristic at a predetermined port of the diplexer 109 according to a preferred embodiment of the present invention.
Figure 26B:
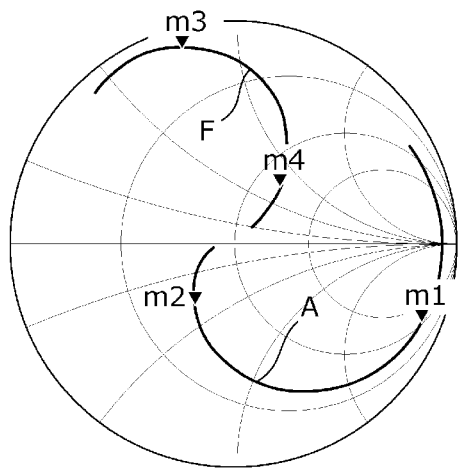
FIG. 26B illustrates, on a Smith chart, a reflection-coefficient-frequency characteristic at a predetermined port of the diplexer 109P according to the comparative example where the inductor L11 is absent.
Figure 26C:
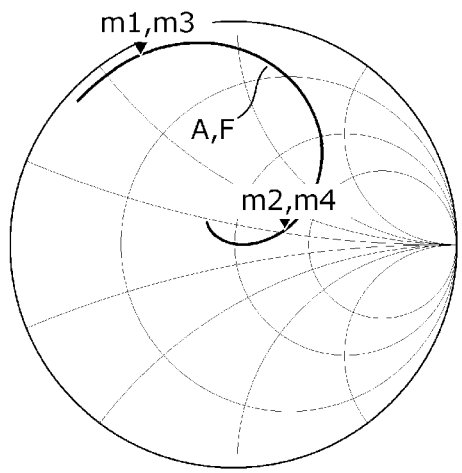
FIG. 26C illustrates, on a Smith chart, a reflection-coefficient-frequency characteristic at a predetermined port of the diplexer 109P according to the comparative example where the inductor L11 is present.

FIG. 26A illustrates, on a Smith chart, a reflection-coefficient-frequency characteristic at a predetermined port of the diplexer 109 according to this preferred embodiment. FIG. 26B illustrates, on a Smith chart, a reflection-coefficient-frequency characteristic at a predetermined port of the diplexer 109P according to the comparative example where the inductor L11 is absent. FIG. 26C illustrates, on a Smith chart, a reflection-coefficient-frequency characteristic at a predetermined port of the diplexer 109P according to the comparative example where the inductor L11 is present.

In each of FIGS. 26A, 26B, and 26C, a curve A denotes the characteristic seen from the common port Pc, and a curve F denotes the characteristic seen from the individual port Pr1. In addition, each marker and the frequency have the following relationship.

m1, m3: 960 MHz
m2, m4: 1.7 GHz

As is clear from the comparison between FIGS. 26A, 26B, and 26C, in the diplexer 109 according to this preferred embodiment, the filter is substantially open in a low band (960 MHz) seen from the common port PC, and matching to a predetermined impedance (50Ω) is performed in a high band (1.7 GHz). In addition, matching to the predetermined impedance (50Ω) is performed in a high band (1.7 GHz) seen from the individual port Pr1.

Figure 27A:
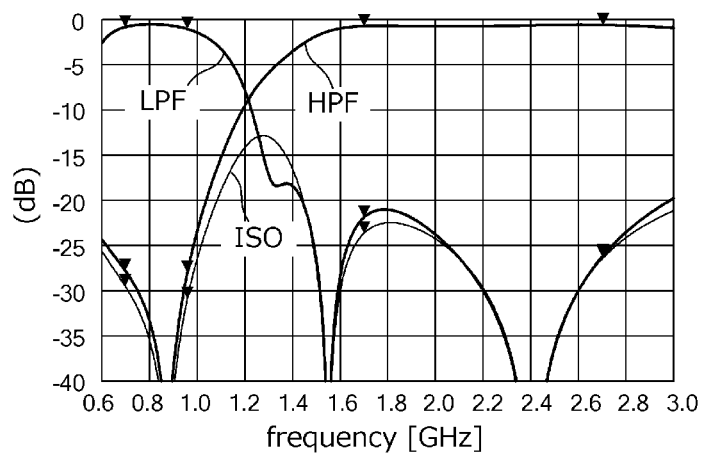
FIG. 27A illustrates an insertion-loss-frequency characteristic between a common port Pc and each of individual ports Pr1 and Pr2 in the diplexer 109 according to a preferred embodiment of the present invention.
Figure 27B:
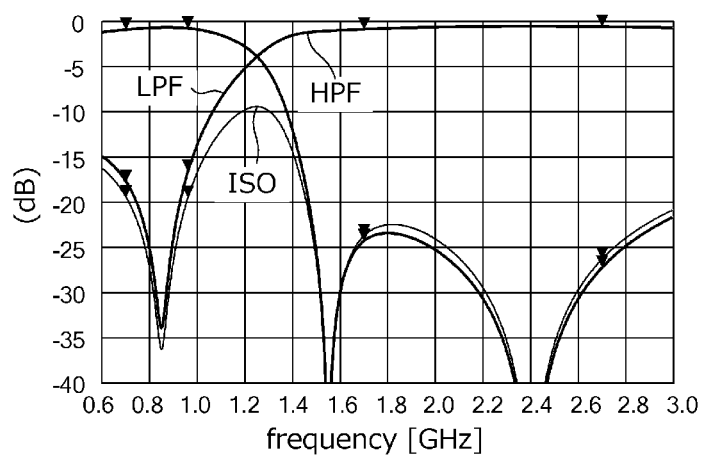
FIG. 27B illustrates an insertion-loss-frequency characteristic between the common port Pc and each of the individual ports Pr1 and Pr2 in the diplexer 109P according to the comparative example where the inductor L11 is absent.
Figure 27C:
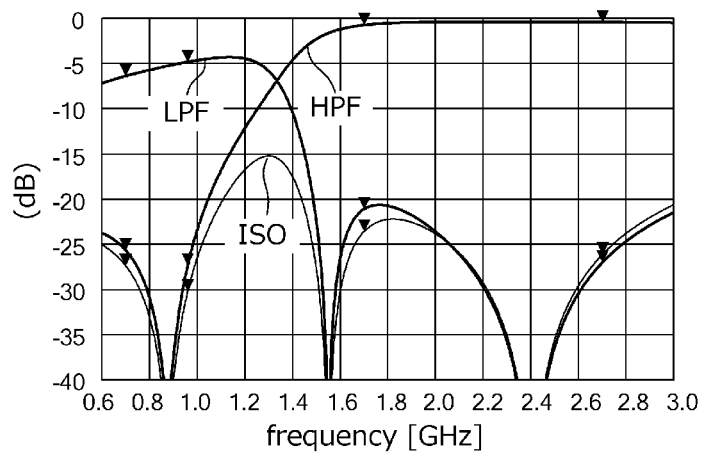
FIG. 27C illustrates an insertion-loss-frequency characteristic between the common port Pc and each of the individual ports Pr1 and Pr2 in the diplexer 109P according to the comparative example where the inductor L11 is present.

FIG. 27A illustrates an insertion-loss-frequency characteristic between the common port Pc and each of the individual ports Pr1 and Pr2 in the diplexer 109 according to this preferred embodiment. FIG. 27B illustrates an insertion-loss-frequency characteristic between the common port Pc and each of the individual ports Pr1 and Pr2 in the diplexer 109P according to the comparative example where the inductor L11 is absent. FIG. 27C illustrates an insertion-loss-frequency characteristic between the common port Pc and each of the individual ports Pr1 and Pr2 in the diplexer 109P according to the comparative example where the inductor L11 is present.

In FIGS. 27A, 27B, and 27C, a curve LPF denotes the characteristic of the low-pass filter LPF, a curve HPF denotes the characteristic of the high-pass filter HPF, and a curve ISO denotes the characteristic of isolation between ports.

As is clear from the comparison between FIGS. 27A, 27B, and 27C, in the diplexer 109P according to the comparative example where the inductor L11 is absent, as illustrated in FIG. 27B, the obtained isolation ISO between ports is only about −10 dB. In the diplexer 109P according to the comparative example where the inductor L11 is present, as illustrated in FIG. 27C, the insertion loss of the low-pass filter LPF in a low band (greater than or equal to 700 MHz and less than or equal to 960 MHz) reaches −5 dB.

In contrast, in the diplexer 109 according to this preferred embodiment, the insertion loss of the low-pass filter LPF in the low band is less than or equal to −1 dB, and the attenuation amount in a high band (greater than or equal to 1.7 GHz and less than or equal to 2.7 GHz) is greater than or equal to −30 dB. In addition, the insertion loss of the high-pass filter HPF in a high band is less than or equal to −1 dB, and the attenuation amount in a low band is greater than or equal to −28 dB.

Tenth Preferred Embodiment

A tenth preferred embodiment of the present invention will describe a multiplexer including a plurality of SAW filters and a phase shifter together with these SAW filters. This multiplexer is an example of the "multi/demultiplexer" according to a preferred embodiment of the present invention.

Figure 28:
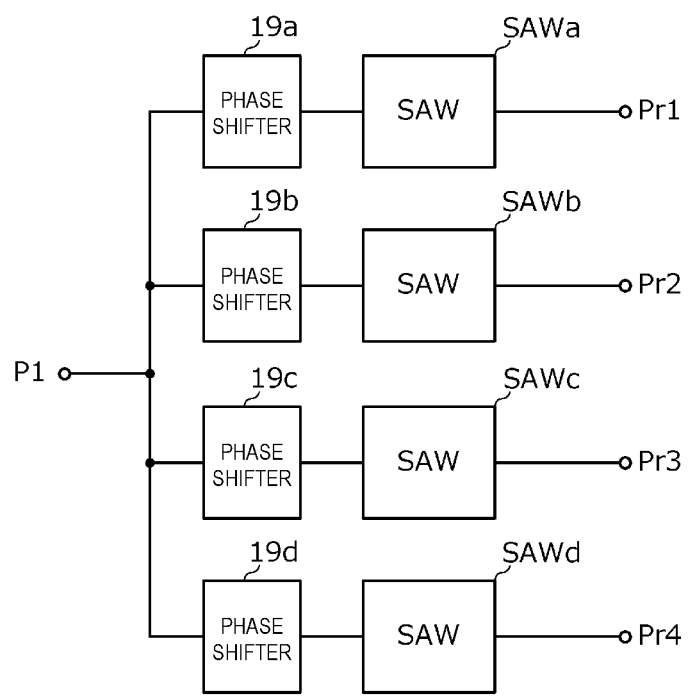
FIG. 28 is a circuit diagram illustrating a configuration of a multiplexer 110 according to a tenth preferred embodiment of the present invention.

FIG. 28 is a circuit diagram illustrating a configuration of a multiplexer 110 according to the tenth preferred embodiment. The multiplexer 110 includes phase shifters 19a, 19b, 19c, and 19d and SAW filters SAWa, SAWb, SAWc, and SAWd, each of which is connected between the common port Pc and each of individual ports Pr1, Pr2, Pr3, and Pr4. Each of the phase shifters 19a, 19b, 19c, and 19d is the transformer-type phase shifter described in some of the above preferred embodiments. In this preferred embodiment, for example, an antenna is connected to the common port Pc, and a communication circuit for a corresponding frequency band is connected to each of the individual ports Pr1, Pr2, Pr3, and Pr4.

Each of the SAW filters SAWa, SAWb, SAWc, and SAWd includes a first port and a second port, and the pass frequency bands thereof are different from one another. The first port of the first SAW filter SAWa is connected to the common port Pc via the phase shifter 19a, and the second port thereof is connected to the individual port Pr1. Similarly, the first port of the second SAW filter SAWb is connected to the common port Pc via the phase shifter 19b, and the second port thereof is connected to the individual port Pr2; the first port of the third SAW filter SAWc is connected to the common port Pc via the phase shifter 19c, and the second port thereof is connected to the individual port Pr3; and the first port of the fourth SAW filter SAWd is connected to the common port Pc via the phase shifter 19d, and the second port thereof is connected to the individual port Pr4.

For example, the center frequency of the pass band of the first SAW filter SAWa is 700 MHz, the center frequency of the pass band of the second SAW filter SAWb is 800 MHz, and the center frequency of the pass band of the third SAW filter SAWc is 900 MHz. In addition, the center frequency of the pass band of the fourth SAW filter SAWd is 2 GHz. That is, the SAW filters SAWa, SAWb, and SAWc are for a low band, and the SAW filter SAWd is for a high band.

The phase shifter 19a shifts the phase such that the first SAW filter SAWa is substantially open in pass frequency bands of the SAW filters SAWb, SAWc, and SAWd, which are other than the first SAW filter SAWa, seen from the common port Pc. In addition, the phase shifter 19b shifts the phase such that the second SAW filter SAWb is substantially open in pass frequency bands of the SAW filters SAWa, SAWc, and SAWd, which are other than the second SAW filter SAWb, seen from the common port Pc. The phase shifter 19c shifts the phase such that the third SAW filter SAWc is substantially open in pass frequency bands of the SAW filters SAWa, SAWb, and SAWd, which are other than the third SAW filter SAWc, seen from the common port Pc. Similarly, the phase shifter 19d shifts the phase such that the fourth SAW filter SAWd is substantially open in pass frequency bands of the SAW filters SAWa, SAWb, and SAWc, which are other than the fourth SAW filter SAWd, seen from the common port Pc.

Figure 29:
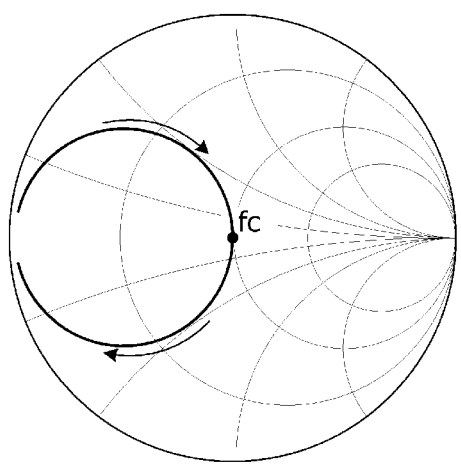
FIG. 29 illustrates, on a Smith chart, a reflection-coefficient-frequency characteristic seen from a port of a typical SAW filter.
Figure 30A:
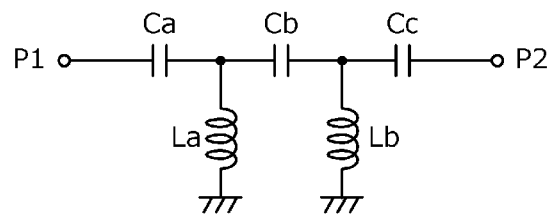
FIG. 30A is a circuit diagram of a high-pass-filter-type phase shifter.
Figure 30B:
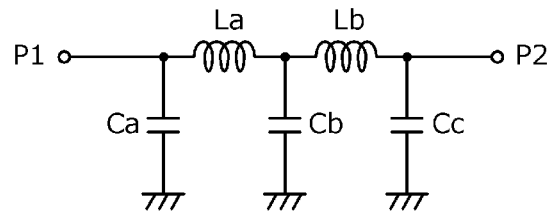
FIG. 30B is a circuit diagram of a low-pass-filter-type phase shifter.
Figure 31:
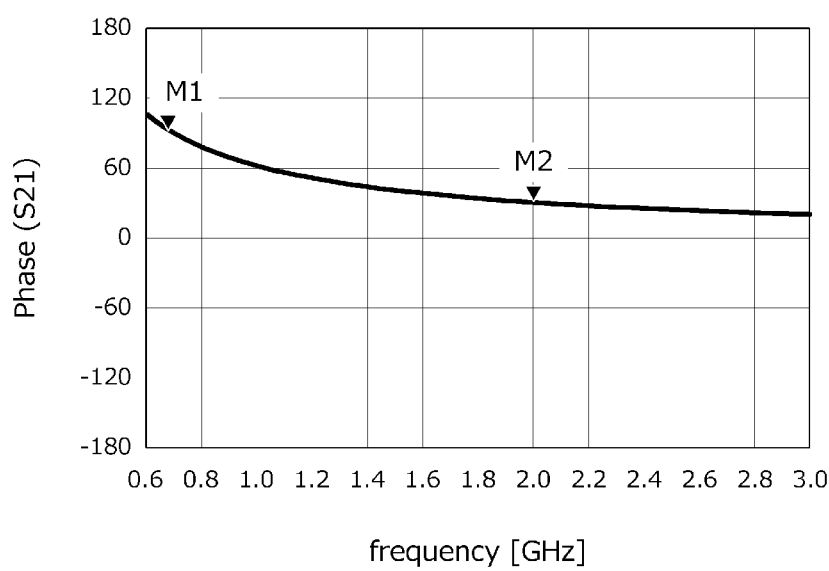
FIG. 31 illustrates an example of a phase-frequency characteristic of a high-pass-filter-type phase shifter illustrated in FIG. 30A.
Figure 32:
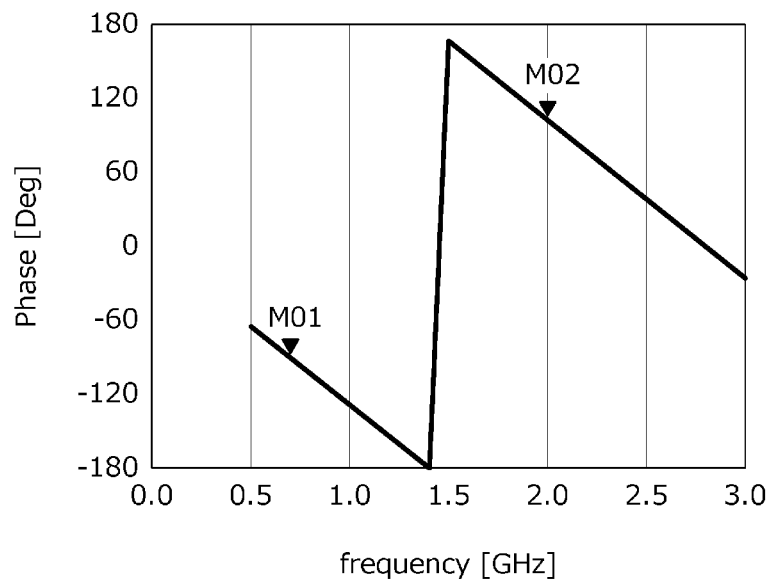
FIG. 32 illustrates an example of a phase-frequency characteristic of a low-pass-filter-type phase shifter illustrated in FIG. 30B.
Figure 33:
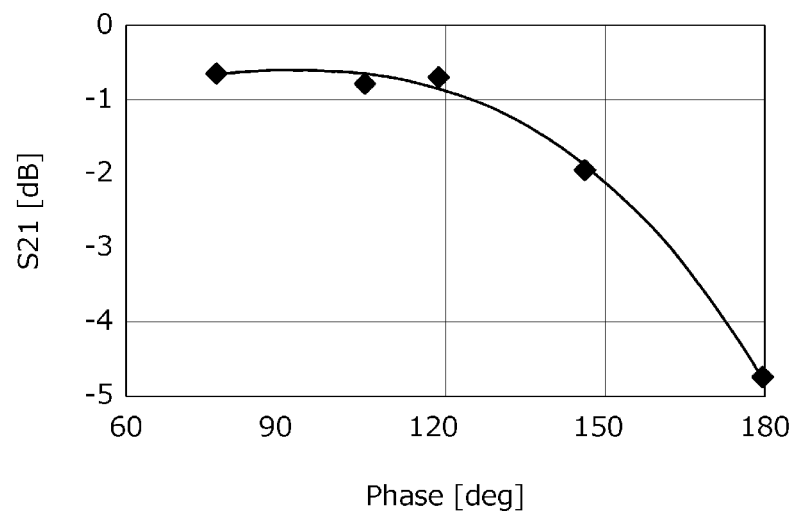
FIG. 33 illustrates an example of an insertion-loss characteristic with respect to the phase of the high-pass-filter-type phase shifter illustrated in FIG. 30A.
Figure 34:
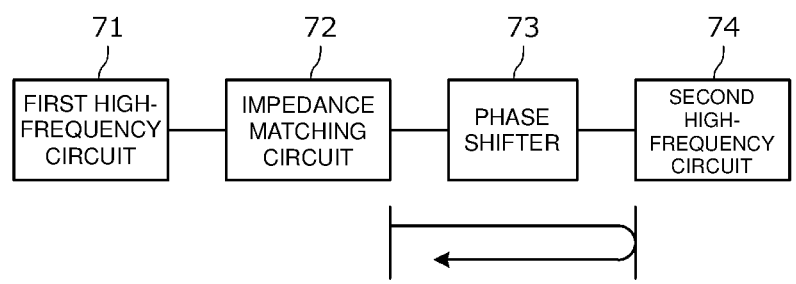
FIG. 34 illustrates an example of a circuit configuration for impedance matching between the first high-frequency circuit 71 and the second high-frequency circuit 74.

FIG. 29 illustrates, on a Smith chart, a reflection-coefficient-frequency characteristic seen from a port of a typical SAW filter. The impedance is substantially short-circuited in a frequency band lower than the pass band, the predetermined impedance (i.e., about 50Ω) is obtained at a center frequency fc of the pass frequency band, and the impedance is substantially short-circuited again in a frequency band higher than the pass band.

Accordingly, if a plurality of SAW filters with markedly different pass frequency bands are directly connected to a common port, in a use frequency band, the common port Pc is substantially short-circuited to the ground. Therefore, for example, a low-band SAW filter and a high-band SAW filter are regarded as being short-circuited to each other and thus cannot be directly connected to the common port Pc.

According to this preferred embodiment, even if SAW filters with markedly different pass frequency bands are used, since the phase shifter shifts the phase about 180°, the SAW filters are regarded as being open to each other. Therefore, the SAW filters can be directly connected to the common port Pc via the phase shifters. In this state, isolation between ports is maintained.

The phase-shift amount of each of the above-described phase shifters 19a to 19d is not limited to 180°, and an appropriate phase-shift amount in accordance with the frequency band may be determined. For example, it is possible to use a transformer-type phase shifter in which the phase-shift amount has a frequency characteristic, which has been described in the second and eighth preferred embodiments.

Considering the case where each of the phase shifters 19a to 19d illustrated in FIG. 28 includes a high-pass-filter-type phase shifter of the related art, the frequency characteristic has a steep slope (frequency characteristic is large) due to the characteristics of L and C. Accordingly, a predetermined phase-shift amount can be obtained only in a narrow band, and thus it is not possible to maintain isolation between ports in a wide band. Therefore, in the related art, if a plurality of SAW filters with markedly different frequency bands are used, a circuit has been configured such that a diplexer demultiplexes a high-band signal and a low-band signal and that the plurality of SAW filters are switched by using a switch for each band.

The mechanism to achieve phase adjustment according to a preferred embodiment of the present invention uses a transformer. Therefore, comparing the mechanism according to a preferred embodiment of the present invention with mechanisms for phase adjustment of a high-pass-filter type, a low-pass-filter type, and a line type, the change in the phase-shift amount depending on the change in the frequency is small. Accordingly, the phase is able to be made to be inverse in a larger band than in the related art in order to open a filter, and it is possible to connect an SAW filter in a larger band.

For example, by designing a configuration such that the phase is shifted 180° to be inverse in a band lower than the frequency used by the SAW filter, that the phase is substantially 0° in a pass band of the SAW filter, and that the phase is shifted −180° in a high frequency band, it is possible to multiplex and demultiplex signals with markedly different frequency bands while maintaining isolation between ports without using a diplexer or a switch.

Other Preferred Embodiments

Some of the above-described preferred embodiments of the present invention have illustrated examples in which the impedance adjustment circuit that adjusts the impedance of the transformer includes the three capacitance elements C1, C2, and C3. The impedance adjustment circuit is a circuit that corrects or actively modifies the displacement in the impedance due to the parallel inductance component and the series inductance component, which are parasitic components of the transformer. Accordingly, the impedance adjustment circuit is not necessarily defined by the three capacitance elements. The impedance of the transformer T may be finely adjusted by connecting the transformer to a predetermined reactance element in parallel or in series.

Note that in the above-described preferred embodiments of the present invention, the first capacitance element C1 and the second capacitance element C2 are not limited to capacitance between wires of coils, and conductor patterns other than coils may be provided. In addition, a capacitor may be connected as an externally attached component. Furthermore, the third capacitance element C3 is not limited to capacitance between coils, and conductor patterns other than coils may be provided. In addition, a capacitor may be connected as an externally attached component.

Lastly, the above-described preferred embodiments of the present invention are illustrative in all points and are not limiting. A person skilled in the art may make changes or modifications as appropriate. For example, elements or features of the configurations described in different preferred embodiments may be replaced or combined with each other. The scope of the present invention is to be defined by the scope of the claims, not the above-described preferred embodiments. In addition, the scope of the present invention is to include equivalents to the scope of the claims and all changes within the scope of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A phase shifter comprising:
a transformer connected between a first port and a second port and including a first coil and a second coil that is magnetically coupled to the first coil, the transformer including a parasitic inductance component; and
an impedance adjustment circuit including a reactance element that suppresses a deviation in impedance due to the parasitic inductance component of the transformer; wherein
a coupling coefficient between the first coil and the second coil of the transformer and a value of the reactance element of the impedance adjustment circuit are determined such that a phase-shift amount changes in accordance with a frequency band.

2. A phase shifter comprising:
a transformer connected between a first port and a second port and including a first coil and a second coil that is magnetically coupled to the first coil, the transformer including a parasitic inductance component; and
an impedance adjustment circuit including a reactance element that suppresses a deviation in impedance due to the parasitic inductance component of the transformer; wherein
a coupling coefficient between the first coil and the second coil of the transformer and a value of the reactance element of the impedance adjustment circuit are determined such that a phase-shift amount in a low band is closer to 180° than 90° and that a phase-shift amount in a high band is closer to 90° than 180°.

3. A phase shifter comprising:
a transformer connected between a first port and a second port and including a first coil and a second coil that is magnetically coupled to the first coil, the transformer including a parasitic inductance component; and
an impedance adjustment circuit including a reactance element that suppresses a deviation in impedance due to the parasitic inductance component of the transformer; wherein
a coupling coefficient between the first coil and the second coil of the transformer and a value of the reactance element of the impedance adjustment circuit are determined such that a phase-shift amount in a low band is closer to 90° than 0° and that a phase-shift amount in a high band is closer to 0° than 90°.

4. The phase shifter according to claim 1, wherein the impedance adjustment circuit includes:
a first capacitance element connected between the first port connected to the transformer and a ground;
a second capacitance element connected between the second port connected to the transformer and the ground; and
a third capacitance element connected between the first port and the second port connected to the transformer.

5. The phase shifter according to claim 1, wherein the impedance adjustment circuit includes:
a first capacitance element connected between the first port connected to the transformer and a ground;
a second capacitance element connected between the second port connected to the transformer and the ground; and
a series circuit including a third capacitance element and an inductance element, the series circuit being connected between the first port and the second port connected to the transformer.

6. The phase shifter according to claim 4, wherein the third capacitance element is mainly defined by a capacitance between the first coil and the second coil.

7. The phase shifter according to claim 4, wherein the first capacitance element is mainly defined by a capacitance between wires of the first coil, and the second capacitance element is mainly defined by a capacitance between wires of the second coil.

8. The phase shifter according to claim 1, wherein
a transformer ratio between the first coil and the second coil is 1:n where n is a value other than 1; and
a phase-shift amount of the phase shifter is moved toward a center of a Smith chart by a reflection coefficient being moved from a high-impedance side to a low-impedance side on the Smith chart and impedance conversion by the phase shifter.

9. The phase shifter according to claim 1, wherein the transformer is provided in a single stack in which a plurality of base layers are stacked, and the first coil and the second coil are defined by conductor patterns provided on the base layers.

10. The phase shifter according to claim 9, wherein the first coil and the second coil have a same or a substantially same inside diameter, and a same or a substantially same outside diameter and have co-axial coil winding axes.

11. The phase shifter according to claim 1, further comprising a high-pass filter or a low-pass filter connected in series to the phase shifter.

12. The phase shifter according to claim 11, wherein the high-pass filter or the low-pass filter includes a capacitance element and an inductance element, the inductance element being magnetically coupled to the first coil or the second coil.

13. An impedance matching circuit comprising:
the phase shifter according to claim 1; and
an impedance matching circuit that is connected in series to the phase shifter; wherein
the impedance matching circuit performs impedance matching of an impedance with a phase shifted by the phase shifter.

14. The impedance matching circuit according to claim 13, wherein
the phase shifter moves impedance in a low band to a second quadrant or a third quadrant on a Smith chart; and
the impedance matching circuit moves both impedance in a high band and the impedance in the low band toward a center of the Smith chart.

15. A multi/demultiplexer comprising:
the phase shifter according to claim 1;
a high-pass filter that performs high-band passing; and
a low-pass filter that performs low-band passing; wherein
the high-pass filter includes a shunt-connected first inductor between a signal line and a ground and a first capacitor connected in series in a following stage of the first inductor;
the low-pass filter includes a second inductor connected in series to a common port and a second capacitor connected in shunt to the ground in a following stage of the second inductor;
the phase shifter is inserted between the common port and the first inductor; and
the phase shifter shifts a phase such that the high-pass filter for high-band passing is substantially open in a pass frequency band of the low-pass filter for low-band passing seen from the common port.

16. A multi/demultiplexer comprising:
the phase shifter according to claim 1; and
a plurality of surface acoustic wave filters including a first surface acoustic wave filter and a second surface acoustic wave filter with mutually different pass frequency bands, the first surface acoustic wave filter and the second surface acoustic wave filter each including a first port and a second port; wherein
the first port of the first surface acoustic wave filter is connected to a common port via the phase shifter, and the second port of the first surface acoustic wave filter is connected to an individual port; and
the phase shifter shifts a phase such that the first surface acoustic wave filter is substantially open in a pass frequency band of the second surface acoustic wave filter seen from the common port.

17. A communication terminal apparatus comprising:
a feeder circuit; and
an antenna connected to the feeder circuit; wherein
between the feeder circuit and the antenna, the phase shifter according to claim 1 is provided.

18. A communication terminal apparatus comprising:
a feeder circuit; and
an antenna connected to the feeder circuit; wherein
between the feeder circuit and the antenna, the impedance matching circuit according to claim 13 is provided.

19. A communication terminal apparatus comprising:
a feeder circuit; and
an antenna connected to the feeder circuit; wherein
between the feeder circuit and the antenna, the multi/demultiplexer according to claim 15 is provided.

* * * * *